United States Patent
Kim et al.

(10) Patent No.: US 11,670,355 B2
(45) Date of Patent: Jun. 6, 2023

(54) ACCELERATOR CONTROLLING MEMORY DEVICE, COMPUTING SYSTEM INCLUDING ACCELERATOR, AND OPERATING METHOD OF ACCELERATOR

(71) Applicant: SAMSUNG ELECTRONICS CO., LTD., Suwon-si (KR)

(72) Inventors: Minsu Kim, Seongnam-si (KR); Namhyung Kim, Seoul (KR); Daejeong Kim, Seoul (KR); Dohan Kim, Hwaseong-si (KR); Chanik Park, Seongnam-si (KR); Deokho Seo, Suwon-si (KR); Wonjae Shin, Seoul (KR); Changmin Lee, Hwaseong-si (KR); Ilguy Jung, Hwaseong-si (KR); Insu Choi, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 1 day.

(21) Appl. No.: 17/406,511

(22) Filed: Aug. 19, 2021

(65) Prior Publication Data

US 2022/0215871 A1    Jul. 7, 2022

(30) Foreign Application Priority Data

Jan. 6, 2021 (KR) .................. 10-2021-0001476

(51) Int. Cl.
*G11C 7/00*     (2006.01)
*G11C 11/406*   (2006.01)
(Continued)

(52) U.S. Cl.
CPC .... *G11C 11/40615* (2013.01); *G11C 11/4076* (2013.01); *G11C 11/4096* (2013.01); *G11C 11/40618* (2013.01)

(58) Field of Classification Search
CPC ................................... G11C 11/40615
(Continued)

(56) References Cited

U.S. PATENT DOCUMENTS 7,822,904 B2   10/2010   LaBerge
8,854,908 B1   10/2014   Burstein et al.
(Continued)

OTHER PUBLICATIONS

Communication dated Feb. 25, 2022 by the European Patent Office in counterpart European Application No. 21196582.7.

*Primary Examiner* — Hoai V Ho
(74) *Attorney, Agent, or Firm* — Sughrue Mion, PLLC

(57) ABSTRACT

Provided are an accelerator controlling a memory device, a computing system including the accelerator, and an operating method of the accelerator. The accelerator includes: a signal control/monitoring circuit configured to detect an entry to a self-refresh mode of a memory device and an exit from the self-refresh mode based on monitoring a signal provided from a host; an accelerator logic configured to generate a first command/address signal and a first piece of data; and a selector configured to output the first command/address signal and the first piece of data to the memory device based on detection of the entry to the self-refresh mode, and output a second command/address signal and a second piece of data provided from the host, to the memory device, based on detection of the exit from the self-refresh mode.

20 Claims, 14 Drawing Sheets

(51) Int. Cl.
*G11C 11/4076* (2006.01)
*G11C 11/4096* (2006.01)

(58) Field of Classification Search
USPC .......................................................... 365/222
See application file for complete search history.

(56) References Cited

U.S. PATENT DOCUMENTS

| | | |
|---|---|---|
| 9,870,333 B1 | 1/2018 | Lam et al. |
| 10,303,545 B1 | 5/2019 | Meaney et al. |
| 10,607,681 B2 * | 3/2020 | Mazumder ........ G11C 11/40615 |
| 10,628,343 B2 | 4/2020 | Lee |
| 10,649,927 B2 | 5/2020 | Raghava et al. |
| 11,195,568 B1 * | 12/2021 | Atishay .................. G11C 29/42 |
| 2014/0043918 A1 | 2/2014 | Ellis et al. |
| 2014/0281736 A1 | 9/2014 | Kong |
| 2017/0062038 A1 * | 3/2017 | Doo .................. G11C 11/40603 |
| 2019/0392886 A1 * | 12/2019 | Cox ....................... G11C 7/225 |
| 2020/0042247 A1 | 2/2020 | Ryu et al. |
| 2020/0050401 A1 | 2/2020 | Gibb et al. |

\* cited by examiner

ACCELERATOR CONTROLLING MEMORY DEVICE, COMPUTING SYSTEM INCLUDING ACCELERATOR, AND OPERATING METHOD OF ACCELERATOR

CROSS-REFERENCE TO THE RELATED APPLICATION(S)

This application is based on and claims priority under 35 U.S.C. § 119 to Korean Patent Application No. 10-2021-0001476, filed on Jan. 6, 2021 in the Korean Intellectual Property Office, the disclosure of which is incorporated by reference herein in its entirety.

BACKGROUND

The inventive concept relates to an accelerator, and more particularly, to an accelerator controlling a memory device, a computing system including the accelerator, and an operating method of the accelerator.

A system (for example, a computing system) for performing data processing may include a host including a central processing unit (CPU), and a memory device in which data is accessed by the host. The amount of data that needs to be processed by a computing system is increasing greatly, and as one method for improving processing speed, there has been proposed a method of reducing the processing load of the CPU by offloading some operations from the CPU to other processors (for example, an accelerator or the like).

In a computing system as above, a host and the accelerator may share a memory device, and any one of the host and the accelerator may occupy the memory device. In this case, when the accelerator uses the memory device, there may be a situation in which the host cannot access the memory device when needed, or a conflict may occur between the host and the accelerator in utilizing the memory device.

SUMMARY

The inventive concept provides an accelerator capable of improving a stability of a computing system by reducing a possibility of collision while occupying the memory device, as well as capable of improving a data processing speed by allowing a host and the accelerator to efficiently occupy the memory device, and a computing system including the accelerator.

According to an aspect of the inventive concept, there is provided an accelerator including: a signal control/monitoring circuit configured to detect an entry to a self-refresh mode of a memory device and an exit from the self-refresh mode based on monitoring a signal provided from a host; an accelerator logic configured to generate a first command/address signal and a first piece of data; and a selector configured to output the first command/address signal and the first piece of data to the memory device based on detection of the entry to the self-refresh mode, and output a second command/address signal and a second piece of data provided from the host to the memory device, based on detection of the exit from the self-refresh mode.

According to another aspect of the inventive concept, there is provided a computing system including: a memory device comprising one or more channels; a host configured to generate a first command/address signal and a first piece of data, and generate a self-refresh command for controlling the memory device to enter a self-refresh mode; and an accelerator comprising an accelerator logic configured to generate a second command/address signal and a second piece of data, the accelerator being configured to provide the first command/address signal and the first piece of data to the memory device while the host occupies the memory device, and provide the second command/address signal and the second piece of data to the memory device based on detection of the self-refresh command from the host.

According to another aspect of the inventive concept, there is provided an operating method of an accelerator including: receiving a first command/address signal and a first piece of data generated by a host and transmitting the received first command/address signal and the received first piece of data to a memory device; detecting an entry to a self-refresh mode of the memory device by monitoring a signal from the host; generating a first clock signal used for accessing the memory device, based on a result of the detecting; and accessing to the memory device by providing to the memory device: the first clock signal; and a second command/address signal and a second piece of data that are generated by the accelerator.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept are described in detail with reference to the accompanying drawings.

Figure 1:
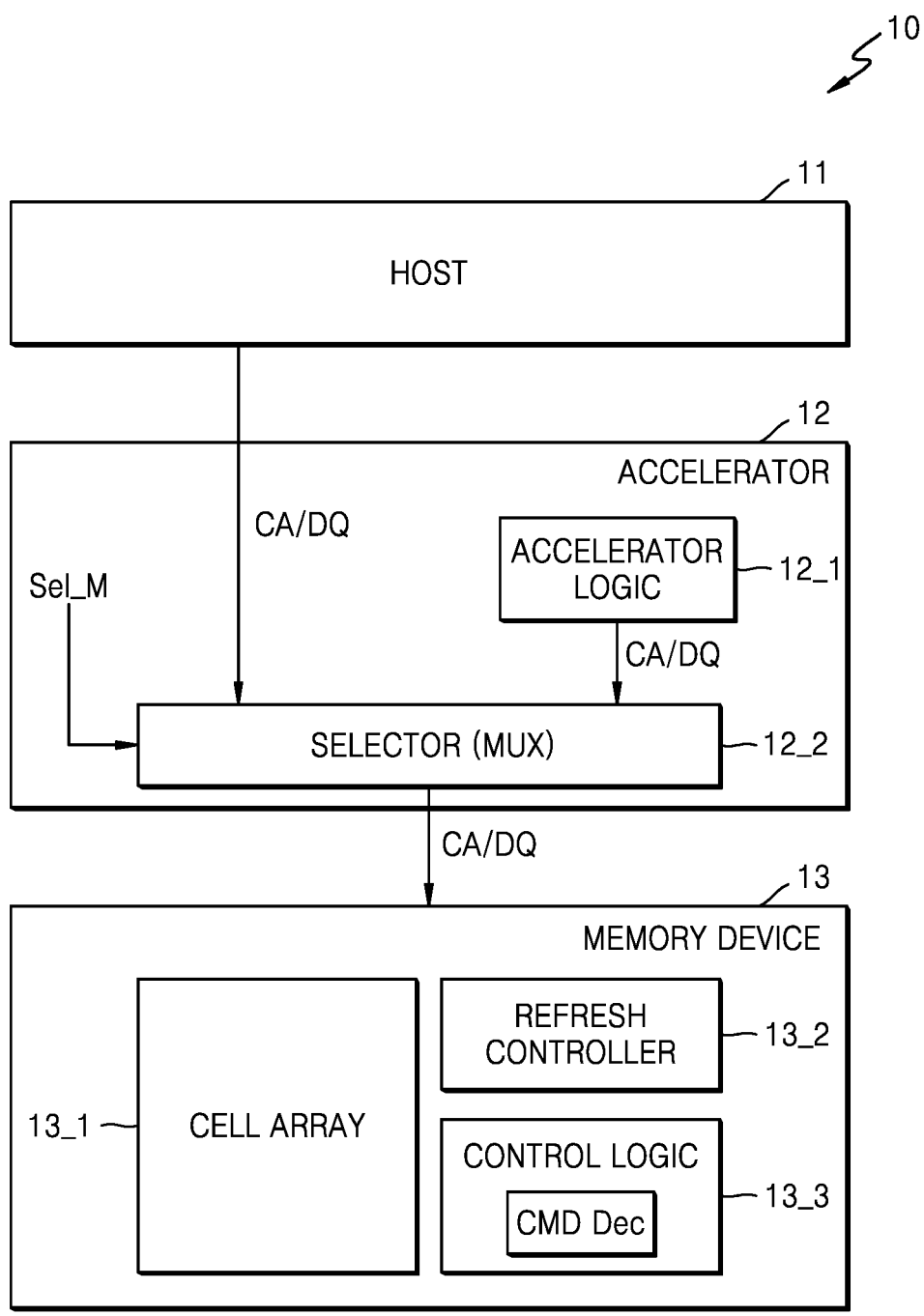
FIG. 1 is a block diagram illustrating a computing system according to an embodiment.

FIG. 1 is a block diagram illustrating a computing system 10 according to an embodiment.

Referring to FIG. 1, the computing system 10 may be variously referred to as a data processing system or a memory system, and may include one or more devices for requesting data access to a memory device 13. Devices for requesting access to the memory device 13 may be referred to as a host device from an aspect of operating as a host with respect to the memory device 13. According to an embodiment, the computing system 10 is illustrated to include a host 11 and an accelerator 12 together with the memory device 13, but the accelerator 12 may also be referred to as a host device in the computing system 10.

The host 11 may include a device corresponding to a central processing unit (CPU) or a device including the CPU, and in addition, may include a memory controller (not illustrated) for generating a command/address signal for accessing the memory device 13. As an example, the host 11 may be implemented as a semiconductor chip such as a (system on chip) SoC, and the memory controller (not illustrated) may be included in the CPU, or may be integrated in the SoC together with the CPU.

At least a portion of computing and/or input/output (I/O) operations executed by the host 11 may be offloaded to the accelerator 12. In some embodiments, the accelerator 12 may include at least one of programmable components such as a graphics processing unit (GPU) and a neural processing unit (BPU), components providing fixed functions such as an internet protocol (IP) core, and reconfigurable components such as a field programmable gate array (FPGA).

The memory device 13 may include various types of memories such as, for example but not limited to, a dynamic random access memory (DRAM) such as a double data rate (DDR) synchronous DRAM (SDRAM) (DDR SDRAM), low power DDR (LPDDR), graphics DDR (GDDR) SDRAM, and rambus DRAM (RDRAM). However, the embodiments are not limited thereto, and each memory device may include various types of memories for performing refresh operations, for example, resistance random access memory such as magnetic RAM (MRAM), ferroelectric RAM (FRAM), and resistive RAM (RRAM).

According to an embodiment, the accelerator 12 may include an accelerator logic 12_1 and a selector 12_2. The accelerator logic 12_1 may include a memory controller (not illustrated) for accessing the memory device 13, and the accelerator logic 12_1 may communicate with the memory device 13 by using a command/address signal CA and data DQ. Communication between the host 11 and the accelerator 12 may be performed based on various protocols, and as an example, peripheral component interconnect express (PCIe) protocol may be applied. However, the embodiments are not limited thereto, and the host 11 and the accelerator 12 may communicate with each other by using various protocols such as, for example but not limited to, a compute express link (CXL) protocol, a XBUS protocol, an NVLINK protocol, an infinity Fabric protocol, a cache coherent interconnect for accelerators (CCIX) protocol, and a coherent accelerator processor interface (CAPI) protocol.

The host 11 may control the memory device 13 to enter various operating modes such as a normal mode, a normal refresh mode, a self-refresh mode, and a power-down mode. According to an embodiment, the accelerator 12 may occupy and use the memory device 13 in at least one of the various operating modes of the memory device 13. As an example, while the host 11 occupies the memory device 13, the selector 12_2 may select the command/address signal CA and the data DQ provided by the host 11 in response to a mode select signal Sel_M, and provide them to the memory device 13. On the other hand, while the accelerator 12 occupies the memory device 13, the selector 12_2 may select the command/address signal CA and the data DQ provided by the accelerator 12, and provide them to the memory device 13.

There may be various cases in which the host 11 does not access the memory device 13. For example, in the normal refresh mode, the self-refresh mode, and the power-down mode, or the like of the memory device 13, the host 11 may not perform an access to the memory device 13. The host 11 may provide a self-refresh command so that the memory device 13 enters the self-refresh mode, and in the self-refresh mode, the host 11 may disable a clock signal provided to the memory device 13. According to an embodiment, the accelerator 12 may occupy and use the memory device 13 in the self-refresh mode of the memory device 13, and the selector 12_2 may select and provide the command/address signal CA and the data DQ provided by the accelerator 12 to the memory device 13.

The accelerator 12 may determine an operation mode of the memory device 13 by monitoring the command and/or signal from the host 11. For example, the accelerator 12 may detect the memory device 13 entering the self-refresh mode or escaping from the self-refresh mode by monitoring at least one of the command/address signal CA and other signals from the host 11, and may generate the mode select signal Sel_M based on the detection result. As an example, in the self-refresh mode, the selector 12_2 may provide the command/address signal CA and the data DQ provided by the accelerator 12 to the memory device 13. However, in other modes than the self-refresh mode, the selector 12_2 may provide the command/address signal CA and the data DQ provided by the host 11 to the memory device 13.

The memory device 13 may include a cell array 13_1, a refresh controller 13_2, and a control logic 13_3. The cell array 13_1 may include a plurality of word lines, and a plurality of memory cells may be connected to each of the plurality of word lines. The memory device 13 may further include an address counter (not illustrated) that generates an address for selecting a word line where the refresh is to be performed, and in the normal refresh operation and the self-refresh operation, the plurality of word lines may be sequentially selected and refreshed.

The refresh controller 13_2 may control the refresh operation on the plurality of word lines in response to the refresh command in the normal refresh operation. In addition, the refresh controller 13_2 may control the refresh operation on the plurality of word lines without intervention of the host 11 in the self-refresh mode. The control logic 13_3 may control all operations of the memory device 13, and as an example, may include a command decoder CMD Dec for controlling an operation of the memory device 13 based on a decoding process on the command/address signal CA from the accelerator 12. According to the operation mode of the memory device 13, the control logic 13_3 may perform various memory operations such as data write and data read by decoding the command/address signal CA from the host 11 or decoding the command/address signal CA from the accelerator 12.

According to an embodiment, even if the self-refresh mode is directed by the host 11, the memory device 13 may receive the command/address signal CA and the data DQ from the accelerator 12, and perform the memory operation in response to a clock signal from the accelerator 12. In addition, in the self-refresh mode directed by the host 11, the memory device 13 may perform the refresh operation (for example, the normal refresh operation) based on a control from the accelerator 12. In other words, even if the host 11 provides the self-refresh command, the memory device 13 may not substantially enter the self-refresh mode, and perform a normal memory operation based on the clock signal and the command/address signal CA from the outside (for example, the accelerator 12).

The accelerator 12 may detect whether the accelerator 12 exits from the self-refresh mode by monitoring a signal from the host 11. For example, while occupying and using the memory device 13, the accelerator 12 may detect whether the accelerator 12 will exit from the self-refresh mode based on the command/address signal CA or other signals (for example, a chip select signal CS_n in FIG. 5). As an example, when the exit from the self-refresh mode is detected based on a change of a logic state of the chip select signal CS_n, the accelerator 12 may perform a series of operations for changing an occupation of the memory device 13 to the host 11. As an example, the accelerator 12 may block (or stop) an operation of generating the clock signal to be provided to the memory device 13, and in addition, may generate the mode select signal Sel_M so that the selector 12_2 selects and provides the command/address signal CA and the data DQ provided by the host 11 to the memory device 13.

According to an embodiment, because the accelerator 12 occupies and uses the memory device 13 during a period of a particular mode (for example, the self-refresh mode) in which the host 11 does not use the memory device 13, an access collision between the host 11 and the accelerator 12 may be prevented and the computing system 10 may be stably operated. As an example, the computing system 10 may include a main board (not illustrated) including one or more slots, on which the memory device 13 is mounted (for example, dual in-line memory modules (DIMM) slot(s) when the memory device 13 includes a memory module such as DIMM), the accelerator 12 may be mounted on a DIMM slot and may selectively access the memory device 13 in the self-refresh mode.

On the other hand, the memory device 13 may communicate with the host 11 and the accelerator 12 by using various specifications such as DDR SDRAM, DDR2 SDRAM, DDR3 SDRAM, DDR4 SDRAM, DDR5 SDRAM, LPDDR SDRAM, LPDDR2 SDRAM, LPDDR3 SDRAM, LPDDR4 SDRAM, LPDDR4X, SDRAM, LPDDR5 SDRAM, GDDR synchronous graphics random access memory (SGRAM), GDDR2 SGRAM, GDDR3 SGRAM, GDDR4 SGRAM, GDDR5 SGRAM, and GDDR6 SGRAM. The accelerator 12 may detect or determine the exit from the self-refresh mode based on signals defined by any of the various specifications listed above, and as an example, may determine the exit by monitoring the chip select signal CS_n defined by DDR5, or may determine the exit by monitoring a separate self-refresh exit command defined by DDR4 or below. In other words, the accelerator 12 may secure stability in using the memory device 13, by monitoring periodically or continuously the exit from the self-refresh mode, and halting the memory operation and completing an operation of changing the occupation of the memory device 13 from the accelerator 12 to the host 11 before a valid command is provided by the host 11.

However, in the above-described embodiment, the accelerator 12 has been described as selectively occupying the memory device 13 in the self-refresh mode, but the embodiment is not limited thereto. For example, as described above, there may be modes such as a power-down mode in which the host 11 does not access the memory device 13, and the embodiment of the inventive concept may be applied to any of the various modes in which the host 11 does not access the memory device 13.

Figure 2:
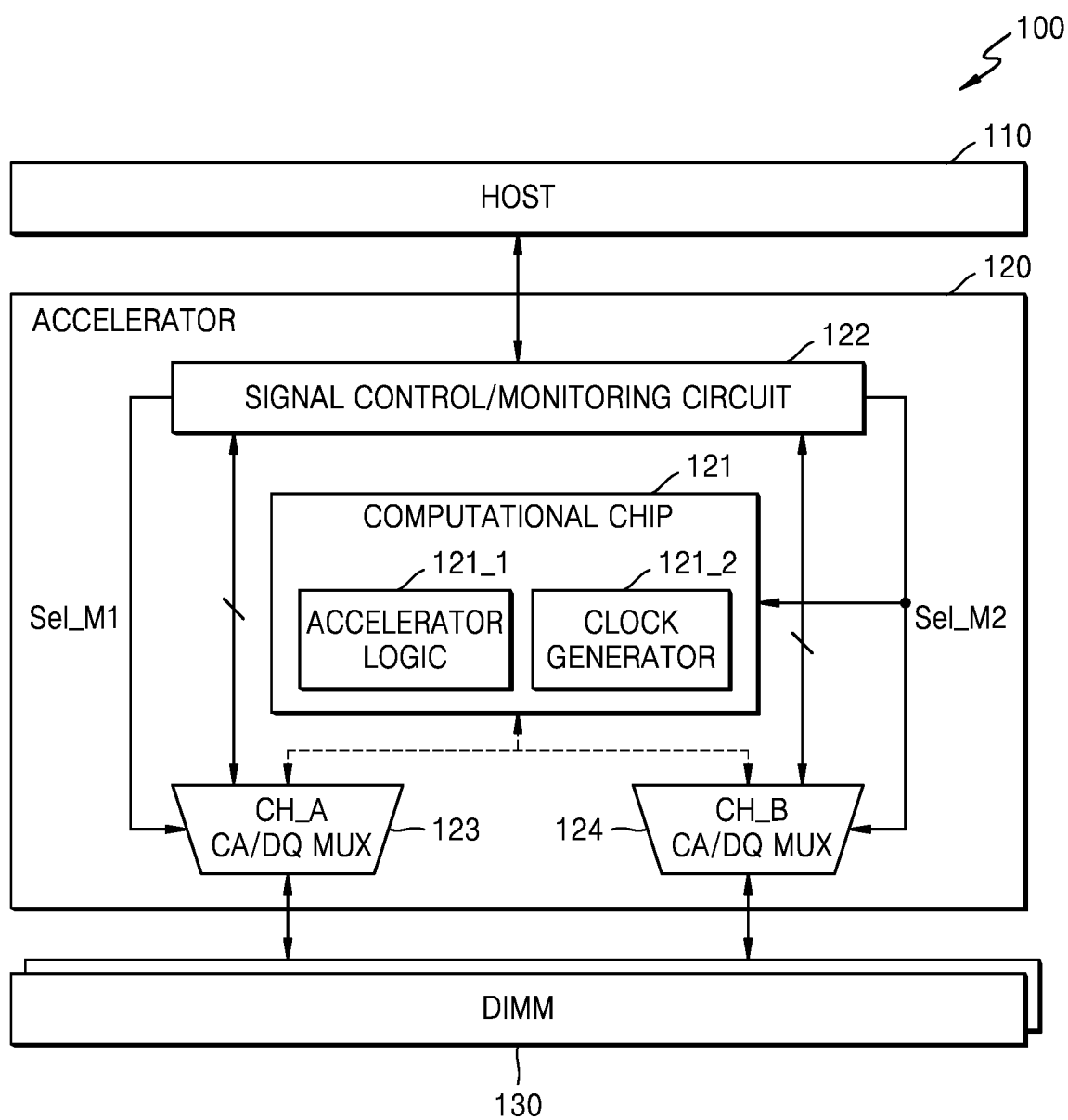
FIG. 2 is a block diagram illustrating an example of an accelerator, according to an embodiment.

FIG. 2 is a block diagram illustrating an example of an accelerator 120, according to an embodiment.

Referring to FIG. 2, a computing system 100 may include a host 110, the accelerator 120, and a memory device 130. The memory device 130 may include one or more memory chips, and in an embodiment, the memory device 130 may include a semiconductor package including one or more memory chips. Alternatively, the memory device 130 may include a memory module in which one or more memory chips are mounted on a module board. In FIG. 2, an example is illustrated in which the memory device 130 includes one or more memory modules, for example, DIMMs.

The accelerator 120 may include a computation chip 121, a signal control/monitoring circuit 122, and one or more selectors (e.g., a first selector 123 and a second selector 124). In FIG. 2, an example is illustrated in which each of the first and second selectors 123 and 124 includes a multiplexer Mux. The computation chip 121 may include an accelerator logic 121_1 and a clock generator 121_2, and the accelerator logic 121_1 may control all operations of the accelerator 120 as illustrated in the above-described example, and perform an accelerating operation by accessing the memory device 130. For example, the accelerator logic 121_1 may include a memory controller (not illustrated) that generates the command/address signal CA for accessing the memory device 130. In addition, the accelerator logic 121_1 may perform a calculation process by using data from the memory device 130, and may store a calculation process result in the accelerator logic 121_1 or in the memory device 130.

The clock generator 121_2 may generate and provide to the memory device 130 one or more clock signals. According to an example, the clock generator 121_2 may include a delay locked loop (DLL), and because the DLL is activated while the accelerator 120 occupies the memory device 130, the clock signal may be provided to the memory device 130. The command/address signal generated by the accelerator logic 121_1 and the clock signal generated by the clock generator 121_2 may be provided together to the memory device 130.

The memory device 130 may include a memory module, and according to the above-described embodiment, may communicate with the host 110 and the accelerator 120 based on various types of specifications. In an embodiment, when the memory device 130 communicates with the host 110 and the accelerator 120 according to the DDR5 specification, the memory device 130 may include at least two channels (or sub-channels), and paths for transmitting various signals may be implemented based on the at least two channels. As an example of signal transmission, the command/address signal CA and the data DQ may be transmitted to the memory device 130 via a separate path with respect to the at least two channels. In addition, according to an example, the memory device 130 may include two channels including a first channel CH_A and a second channel CH_B, and the first and second selectors 123 and 124 may be arranged in correspondence to the first channel CH_A and the second channel CH_B, respectively.

The signal control/monitoring circuit 122 may be implemented as an intellectual property (IP), and may be referred to as a signal control/monitoring IP. The signal control/monitoring circuit 122 may receive and provide to each of the first and second selectors 123 and 124 various signals provided by the host 110. In addition, the signal control/monitoring circuit 122 may control the first and second selectors 123 and 124 based on a monitoring result of the various signals provided by the host 110, and generate first and second mode select signals Sel_M1 and Sel_M2.

As an example, the signal control/monitoring circuit 122 may monitor the command/address signal from the host 110, and in response to receiving the self-refresh command, the accelerator 120 may perform various internal operations for occupying the memory device 130. As an example, by providing the first and second mode select signals Sel_M1 and Sel_M2 to the first and second selectors 123 and 124, the signal control/monitoring circuit 122 may perform the control operation so that the command/address signal CA, the data DQ, and the clock signal generated by the accelerator 120 are provided to the memory device 130. In addition, the signal control/monitoring circuit 122 may perform the control operation so that the command/address signal CA, the data DQ, and the clock signal are generated, by controlling the computation chip 121 in response to receiving the self-refresh command.

During the self-refresh mode, the accelerator 120 may occupy and use the memory device 130, and perform various types of access operations on the memory device 130. As an example, the accelerator 120 may write data to the memory device 130, or may perform the calculation process on data read from the memory device 130 and store a calculation process result in the memory device 130, and accordingly, the data stored in the memory device 130 may be changed while the accelerator 120 occupies the memory device 130. After the occupation of the memory device 130 by the accelerator 120 is completed, the changed data may be fed back to the host 110, and as an example, the host 110 may access the memory device 130 and receive the changed data. Alternatively, the changed data may be stored in the computation chip 121 in the accelerator 120, and after the occupation of the memory device 130 by the accelerator 120 is completed, the host 110 may read the changed data stored in the accelerator 120.

On the other hand, the signal control/monitoring circuit 122 may detect the exit from the self-refresh mode by monitoring the command/address signal or one or more other signals from the host 110. As an example, the chip select signal CS_$n$ according to the DDR5 specification may be provided by the host 110, and the signal control/monitoring circuit 122 may determine whether there is the exit from the self-refresh mode by detecting a change of a logic state (for example, a change from logic low to logic high) of the chip select signal CS_$n$. The signal control/monitoring circuit 122 may detect the exit from the self-refresh mode and control the computation chip 121 and the first and second selectors 123 and 124. As an example, based on detection of the exit from the self-refresh mode of the memory device 130, a clock generation operation of the computation chip 121 may be inactivated, and the command/address signal CA and the data DQ from the host 110 may be provided to the memory device 130 via the first and second selectors 123 and 124 based on controlling the first and second selectors 123 and 124.

Figure 3:
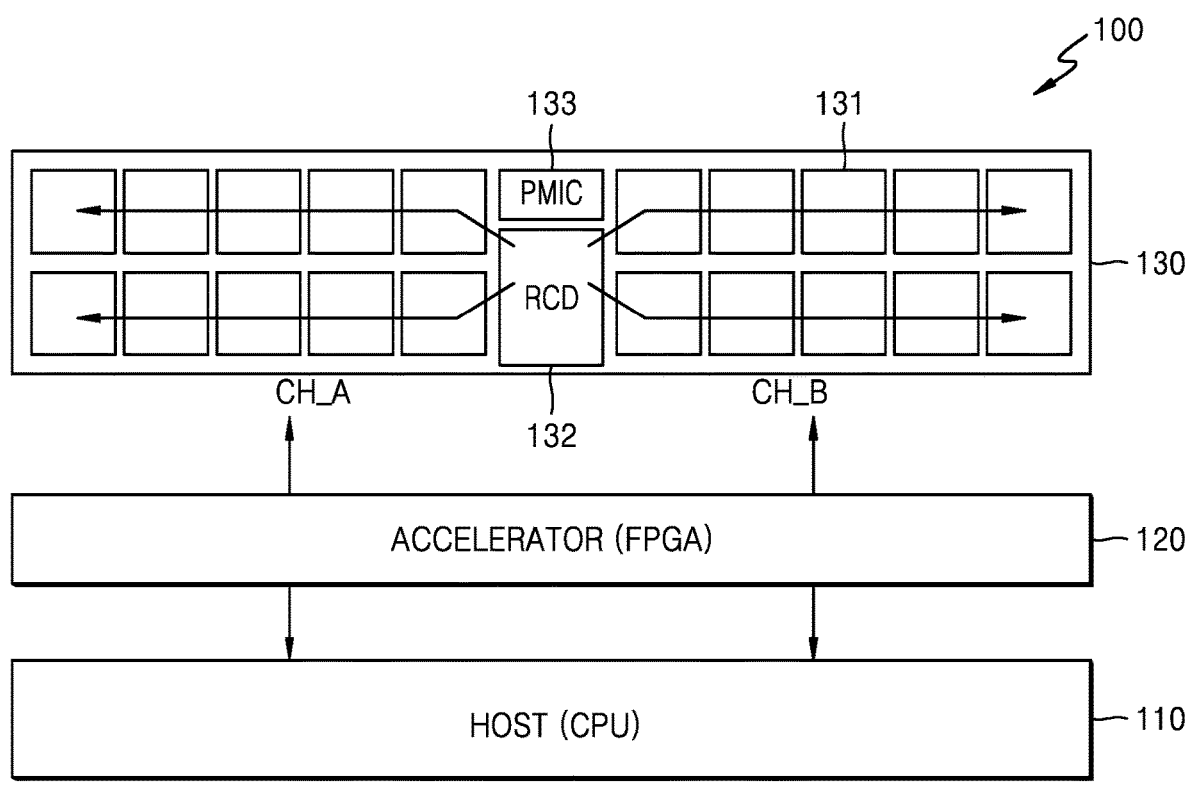
FIG. 3 is a block diagram illustrating a structure of a computing system, according to an embodiment.

FIG. 3 is a block diagram illustrating a structure of the computing system 100, according to an embodiment. In the computing system 100 of FIG. 3, an example of a memory module according to the DDR5 specification as the memory device 130 is illustrated.

Referring to FIGS. 2 and 3, the host 110 may include a CPU, and the accelerator 120 may be arranged between the host 110 and the memory device 130 to perform an accelerating operation, and in FIG. 3, an example is illustrated in which the accelerator 120 includes a field programmable gate array (FPGA). The memory device 130 may include a plurality of memory chips 131 mounted on the module board, and in addition, may include a control chip (for example, a registering clock driver (RCD) 132 that performs a control operation on the plurality of memory chips 131, and a power management integrated circuit (PMIC) 133. In addition, the memory device 130 may include the first channel CH_A and the second channel CH_B as some or all of the plurality of channels, and as an example, some memory chips of the memory device 130 may be included in the first channel CH_A, and other memory chips of the memory device 130 may be included in the second channel CH_B.

The host 110 and the accelerator 120 may control the plurality of memory chips 131 by using the control chip 132. As an example, various signals of the host 110 and the accelerator 120 may be provided to the plurality of memory chips 131 via the control chip 132, and the command/address signal CA and the clock signal in the above-described embodiments may be provided to the plurality of memory chips 131 via the control chip 132, and according to an example, the data DQ may be provided directly to the plurality of memory chips 131 without passing through the control chip 132. In an embodiment, the control chip 132 may transmit the command/address signal CA and the clock signal from the host 110 to the plurality of memory chips 131 while the host 110 occupies the memory device 130, and may transmit the command/address signal CA and the clock signal from the accelerator 120 to the plurality of memory chips 131 while the accelerator 120 occupies the memory device 130.

The PMIC 133 may generate a power voltage used by the memory device 130, and provide the generated power voltage to the plurality of memory chips 131. The control chip 132 may control the PMIC 133, and each of the plurality of memory chips 131 may perform the refresh operation and the normal memory operation based on the power voltage.

On the other hand, although not illustrated in FIG. 3, the memory device 130 may further include a serial presence detect (SPD) chip (not illustrated), and the SPD chip may include electrically erasable programmable read-only memory (EPROM). The SPD chip may include initial information or device information about the memory device 130, and as an example, the SPD chip may include the initial information or the device information such as a module shape, module configuration, storage capacity, a module type, and execution environment of the memory device 130.

As the memory module in a memory module in FIG. 3 includes a plurality of channels, e.g., the first channel CH_A and the second channel CH_B, the embodiments may be applied to the memory module in various types. As an example, the accelerator 120 may selectively access any one of the first channel CH_A and the second channel CH_B, and in an embodiment, while the first channel CH_A is always used by the host 110, the second channel CH_B may be selectively used by any one of the host 110 and the accelerator 120 according to the above-described embodiments. For example, the computing system 100 may be implemented so that, while the memory chips 131 of the first channel CH_A independently perform the self-refresh as the memory chips 131 enters the self-refresh mode, the memory chips 131 of the second channel CH_B perform the memory operation and the normal refresh operation based on the control of the accelerator 120.

Figure 4:
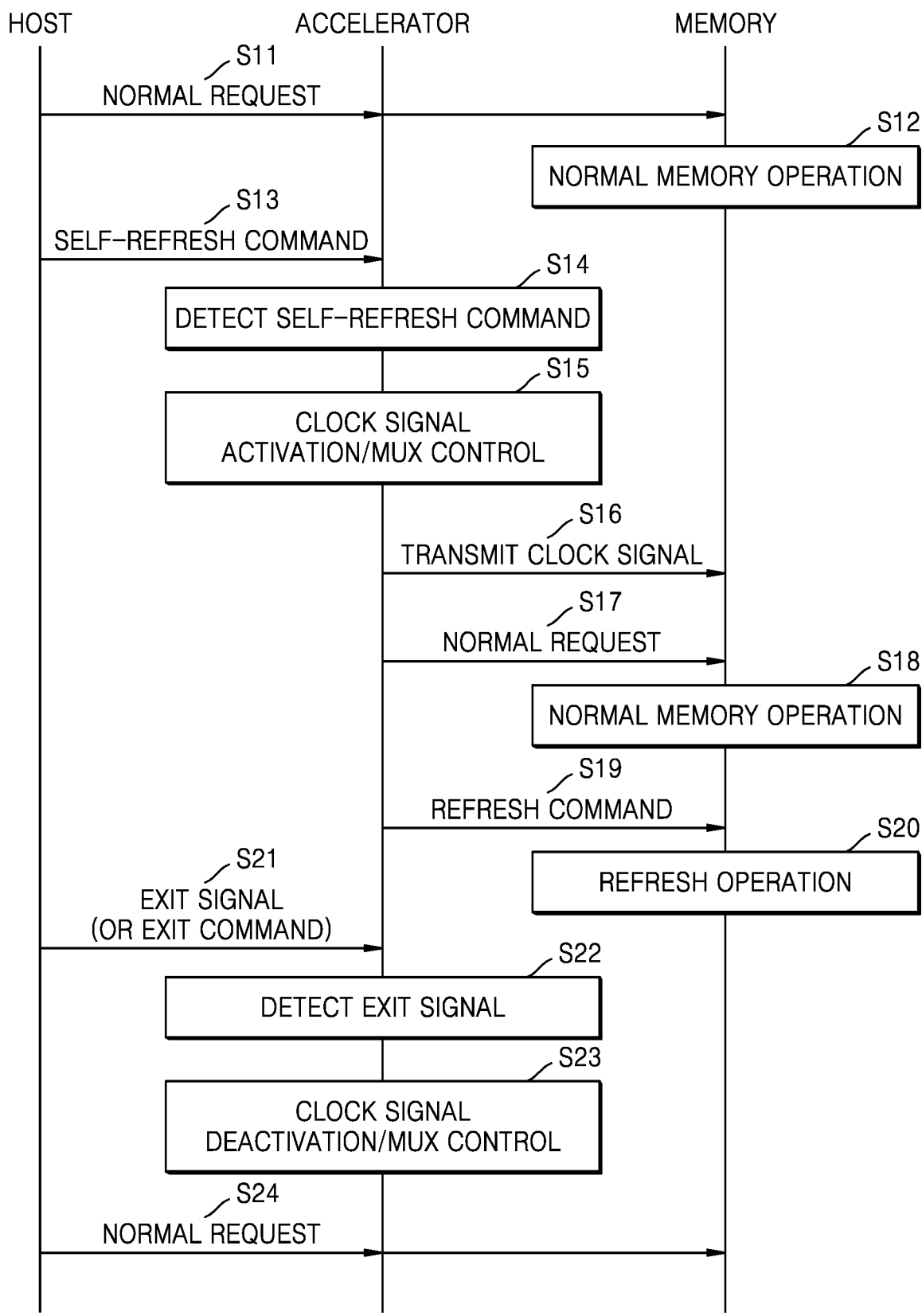
FIG. 4 is a flowchart of an operating method of a computing system, according to an embodiment.

FIG. 4 is a flowchart of an operating method of a computing system, according to an embodiment. In FIG. 4, a host (or CPU), an accelerator, and a memory device are exemplified as components included in the computing system. In addition, in an embodiment, a configuration including a memory controller and a memory device included in at least one of a host and an accelerator may be defined as a memory system.

Referring to FIG. 4, the host may generate and provide to the memory device a normal request (or a memory request) for accessing the memory device (S11). In the embodiment, according to a proposed configuration in which the accelerator is arranged between the host and the memory device, the normal request from the host may be provided to the memory device via the accelerator, and the memory device may perform the normal memory operation corresponding to the normal request (S12).

Thereafter, the host may provide the self-refresh command so that the memory device enters the self-refresh mode (S13). The accelerator may perform monitoring on signals from the host, and may detect an entry into the self-refresh mode based on detection that the host outputs the self-refresh command (S14), and the accelerator may perform operations of generating the clock signal and controlling the selector (MUX) so that the accelerator occupies and uses the memory device (S15).

The accelerator may control various operations while occupying the memory device, and provide the generated clock signal to the memory device (S16). In addition, the accelerator may access the memory device, and generate and provide to the memory device the normal request (S17). The memory device may perform the normal memory operation corresponding to the normal request from the accelerator (S18). In addition, the accelerator may control the refresh operation of the memory device, and in a section of the self-refresh mode directed by the host, may provide to the memory device the refresh command for refreshing a plurality of word lines of the memory device (S19). The memory device may sequentially perform the refresh operation on the plurality of word lines in response to the refresh command from the accelerator (S20).

The host may output a signal directing the memory device an exit from the self-refresh mode (S21). According to an embodiment, the signal requesting an exit from the self-refresh mode may be referred to as an exit signal (or an exit command), and the exit signal may be generated based on a signal defined by various types of specifications. As an example, when the memory device is based on the DDR5 specification according to an above-described embodiment, the accelerator may detect the exit from the self-refresh mode based on a change of a logic state of the chip select signal (S22).

The accelerator may perform a series of operations for changing the occupation of the memory device to the host in response to detection of the exit signal, and as an example, may perform deactivating the clock signal provided to the memory device and an operation of controlling the selector (MUX) (S23). The command/address signal CA and the data DQ may be provided by the host to the memory device by controlling the selector (MUX), and the normal request may be provided to the memory device as the host occupies the memory device again (S24).

Figure 5:
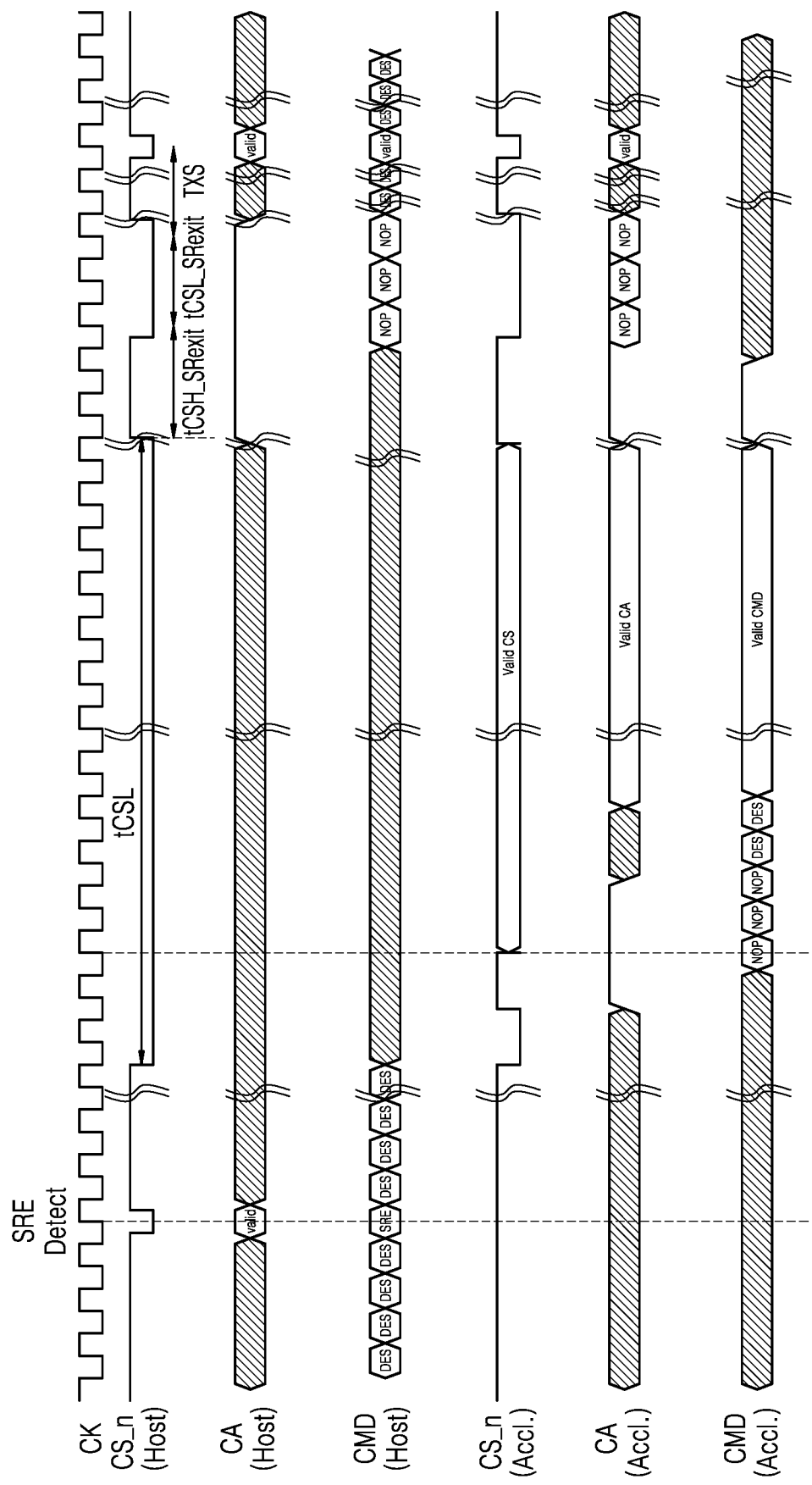
FIG. 5 is a waveform diagram illustrating an example of an operation of a computing system, according to an embodiment.

FIG. 5 is a waveform diagram illustrating an example of an operation of a computing system, according to an embodiment.

Referring to FIG. 5, the host may generate various signals for accessing data of the memory device, and as an example, may generate and output a clock signal CK, the chip select signal CS_n, and the command/address signal CA according to a certain DDR specification. The command/address signal CA may include a plurality of bits, and a command CMD according to a logic state of the plurality of bits may be defined by a command truth table of the DDR specification. As an example, particular logic states of the plurality of bits of the command/address signal CA may define a self-refresh command SRE, the chip select signal CS_n may have a logic low state in correspondence with a timing point at which a valid command is applied, and in addition, when the self-refresh command SRE is provided, the chip select signal CS_n may maintain the logic low state while the memory device operates in the self-refresh mode.

The accelerator according to an embodiment may generate identical or similar signals as signals provided by the host for accessing the memory device, and as an example, may generate and output the chip select signal CS_n and the command/address signal CA. Although not illustrated in FIG. 5, the accelerator may further generate and output a clock signal for synchronizing signals in accessing the memory device. The accelerator may, as the host, access the memory device according to the same DDR specification, and accordingly, the command CMD according to the logic state of the command/address signal CA output by the accelerator may be defined in the same manner as the host.

The accelerator may detect the self-refresh command SRE by monitoring the command/address signal CA from the host. The accelerator may perform a series of operations for occupying the memory device in response to detection of the self-refresh command SRE, may generate the clock signal by activating the delay locked loop (DLL) according to the above-described embodiments, and in addition, may control a selector so that the command/address signal CA and the data DQ generated by the accelerator are provided to the memory device.

After a certain time after the self-refresh command SRE is output, the chip select signal CS_N may maintain the logic low state during a tCSL interval, and the accelerator may access the memory device during the tCSL interval. The accelerator may control memory operations such as read/write operations of the memory device during the tCSL interval, and in addition, may provide a command for performing the refresh of the plurality of word lines of the memory device. In other words, the accelerator may output a valid chip select signal CS_n and a valid command/address signal CA during the tCSL interval, and accordingly, a valid command for controlling the memory operation and the refresh operation may be provided to the memory device.

On the other hand, the accelerator may detect whether there is the exit from the self-refresh mode by monitoring the logic state of a signal (for example, the chip select signal CS_n) from the host. For example, in the DDR5 specification, a case in which the logic state of the chip select signal CS_n is changed from logic low to logic high may indicate an exit from the self-refresh mode, and the chip select signal CS_n may maintain logic high during a first interval tCSH_SRexit and then maintain logic low during a second interval tCSL_SRexit. In addition, the host may provide a no operation command (NOP) for at least three times after the change of the logic state, and the accelerator may perform a preparation for the exit from the self-refresh mode (or a preparation for changing an occupation of the memory device to the host) from a change time point of the logic state of the chip select signal CS_n.

On the other hand, the accelerator may block outputting valid command/address signal CA based on a result of monitoring of the chip select signal CS_n, deactivate an operation of generating the clock signal, and may not output a valid command CMD. As an example, the accelerator may generate and output the NOP for aligning with the host.

According to embodiments described above, whether there is the exit from the self-refresh mode may be monitored while the accelerator occupies and uses the memory device, and a preparation operation for changing the occupation of the memory device to the host may be performed for a sufficient time, and thus, the accelerator may stably occupy and use the memory device. As an example, TXS may be defined as a minimum time interval during which a valid command is actually applied after the last NOP is applied in the DDR5 specification, and because a series of operations for changing the occupation of the memory device to the host is performed from a time point at which the above-described change of the state of the chip select signal CS_$n$ occurs to the TXS interval, the accelerator may stably occupy the memory device, and in addition, may stably change the occupation of the memory device to the host.

Figure 6:
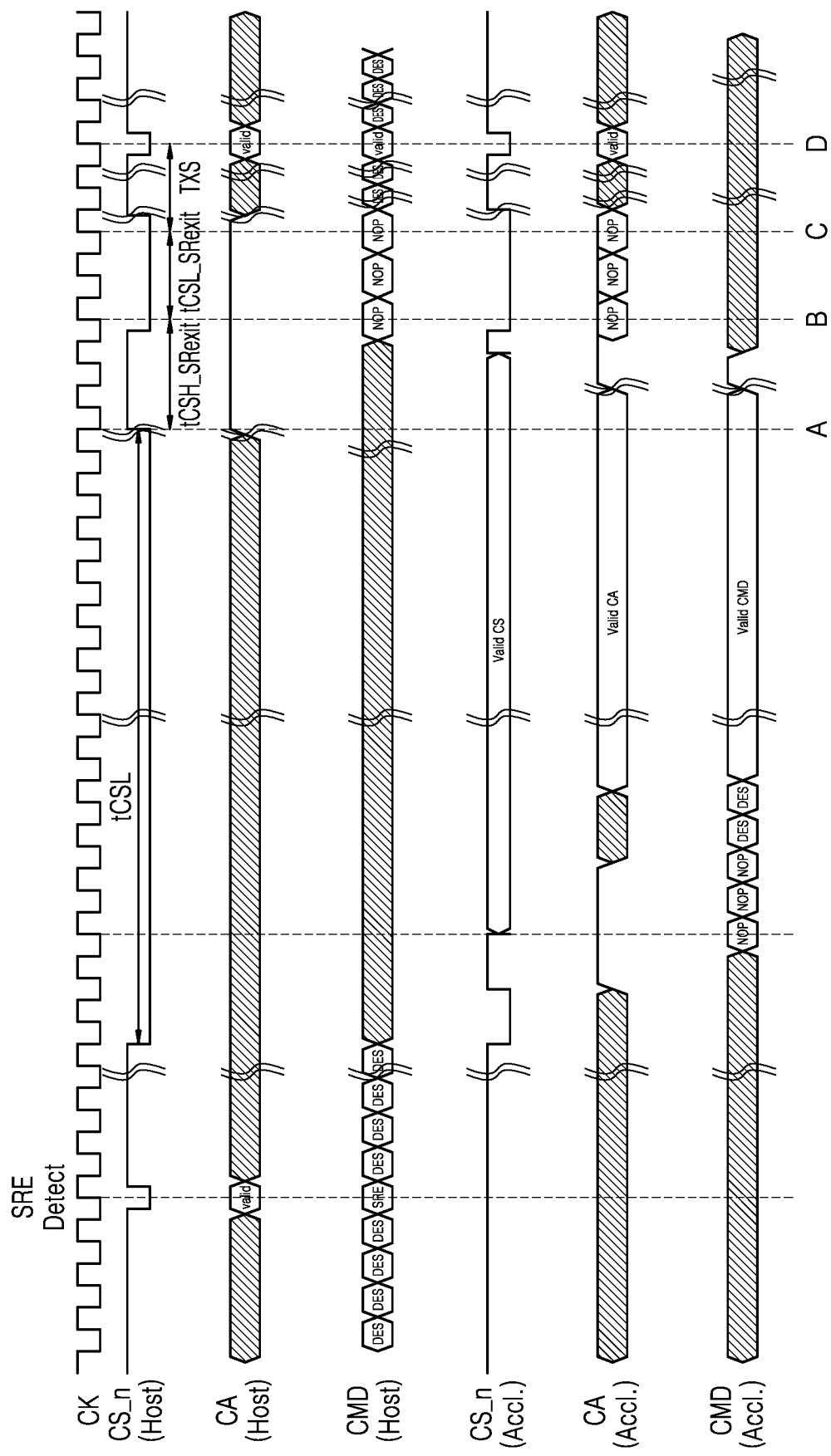
FIGS. 6 and 7 are waveform diagrams illustrating an example of an operation of a computing system, according to another embodiment.
Figure 7:
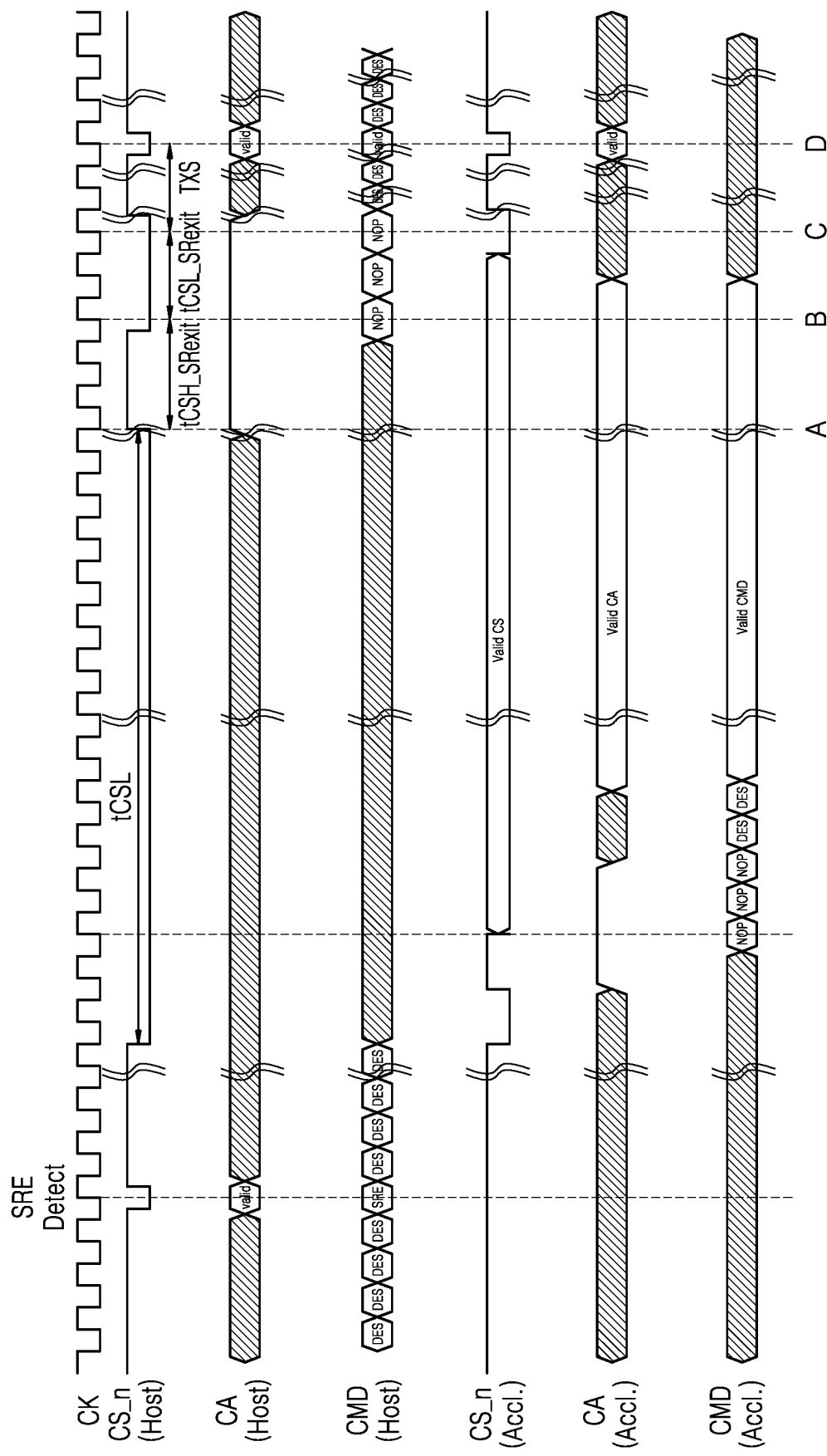

FIGS. 6 and 7 are waveform diagrams illustrating examples of an operation of a computing system, according to another embodiment. In FIGS. 6 and 7, various intervals during which the memory device occupies the memory device are illustrated. In describing the examples of the embodiments illustrated in FIGS. 6 and 7, duplicate descriptions on identical signals to those illustrated in FIG. 5 are omitted.

Referring to FIG. 6, in the same or similar manner as in above-described embodiment, the host may output the command/address signal CA indicating the self-refresh command SRE, and the chip select signal CS_$n$ may maintain a logic low state in the interval during which the memory device indicates the self-refresh mode. Based on a monitoring result of the command/address signal CA, the accelerator may perform a series of preparation operations for occupying and using the memory device in response to detection of the self-refresh command SRE, and may perform memory operations such as read/write operations and a calculation process operation by occupying the memory device during at least the tCSL interval.

According to the above-described embodiment, the accelerator may detect whether there is the exit from the self-refresh mode by monitoring the logic state of the chip select signal CS_$n$ from the host, and it may be assumed that the logic state of the chip select signal CS_$n$ is changed at a time point A. The chip select signal CS_$n$ from the host may maintain logic high during a first interval tCSH_SRexit, and maintain logic low during a second interval tCSL_SRexit. A time point at which a first NOP is applied may be defined as a time point B, and a time point at which a third NOP is applied may be defined as a time point C. In addition, a time point at which the valid command CMD is applied after the TXS interval may be defined as a time point D.

According to an example embodiment, because the accelerator increases a time of occupying the memory device, the utilization of the memory device by the accelerator may be increased. Referring to FIG. 6, an example is illustrated in which an access to the memory device by the accelerator is maintained in an interval between the time point A and the time point B. For example, the accelerator may not immediately perform a series of operations for providing an occupation of the memory device to the host in response to the change of the logic state of the chip select signal CS_$n$, but may maintain an output of the valid chip select signal CS_$n$ in an interval between the time point A and the time point B, and transmit the valid command/address signal CA to the memory device. The accelerator may perform the preparation operation for changing the occupation of the memory device to the host during at least in an interval between the time point B and the time point D.

In FIG. 7, an example is illustrated in which the accelerator occupies and uses the memory device in an interval after the time point B. As an example, when the logic state of the chip select signal CS_$n$ is changed from logic low to logic high as described above, the exit from the self-refresh mode may be detected, and the chip select signal CS_$n$ may maintain logic high during the first interval tCSH_SRexit and then maintain logic low during the second interval tCSL_SRexit. Even after the time point A and the time point B, the accelerator may access the memory device, and as an example, even after the time point B, may maintain outputting the valid chip select signal CS_$n$, and transmit the valid command/address signal CA to the memory device. In the example of FIG. 7, an example is illustrated in which the accelerator accesses the memory device in an interval between the time point B and the time point C. For example, the accelerator may provide the valid chip select signal CS_$n$ in the interval between the time point B and the time point C, and in addition, may output the valid command/address signal CA.

According to an embodiment, the accelerator may perform a series of operations for changing the occupation of the memory device in response to various signals. For example, after a certain time is passed after the time point at which logic high of the chip select signal CS_$n$ changes, the accelerator may stop accessing the memory device, and perform operations for changing the occupation of the memory device. Alternatively, the accelerator may stop accessing the memory device in response to a time point at which the first interval tCSH_SRexit has passed and the chip select signal CS_$n$ changes to logic low, or stop accessing the memory device in response to receiving the NOP. In this manner, the accelerator may provide the valid chip select signal CS_$n$ in the interval between the time point B and the time point C. In addition, in the embodiment illustrated in FIG. 7, because the accelerator accesses the memory device in the interval between the time point B and the time point C, the accelerator may not generate the NOP for aligning with the host.

On the other hand, in the above-described embodiments illustrated in FIGS. 5 through 7, the accelerator is illustrated not to perform a memory operation after the time point C, but the embodiment is not limited thereto. For example, the TXS corresponding to the minimum time interval, during which the valid command is actually applied after a final NOP is applied, may be set sufficiently long. In this case, the accelerator may stop accessing the memory device at a time point after the TXS interval starts as long as the accelerator may sufficiently secure a time interval during which subsequent processes for changing the occupation of the memory device to the host.

Figure 8:
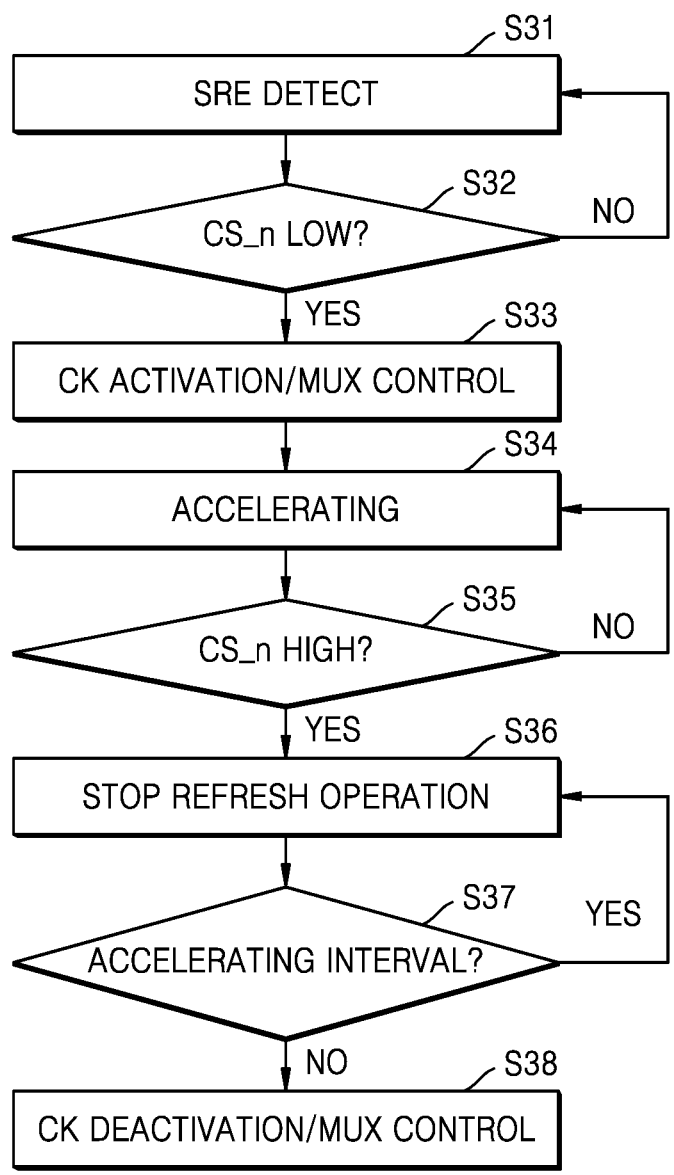
FIG. 8 is a flowchart of an operating method of an accelerator, according to an embodiment.

FIG. 8 is a flowchart of an operating method of an accelerator, according to an embodiment. In FIG. 8, an example of controlling the memory operation and the refresh operation by the accelerator is illustrated.

Referring to FIG. 8, the accelerator may monitor various command/address signals and one or more signals from the host according to the above-described embodiments, and as an example, may detect the self-refresh command SRE provided by the host according to a monitoring result (S31). In addition, a state of the chip select signal CS_$n$ may be changed to a particular state (for example, logic low) after the self-refresh command SRE is applied to direct the self-refresh mode according to the DDR5 specification, and the accelerator may detect whether a level of the chip select signal CS_$n$ has been changed (S32). As the monitoring result, when the level of the chip select signal CS_$n$ has not been changed to logic low, the accelerator may not perform a series of operations for occupying the memory device. On the other hand, when the level of the chip select signal CS_$n$ is changed to logic low, the accelerator may perform the series of operation for occupying the memory device.

As an example of the series of operations, the accelerator may control the selector (MUX) and activate the clock signal (S33), and in addition, the accelerator may perform an accelerating process including data write/read operations by providing valid command/address signals and clock signals (S34). Although not illustrated in FIG. 8, in the self-refresh mode directed by the host, the accelerator may control the refresh operation on the word lines of the memory device by providing the refresh command (for example, a normal refresh mode) and the clock signal to the memory device, and accordingly, the memory device may perform the refresh operation according to a normal refresh method based on the control of the accelerator.

When the exit from the self-refresh mode is defined by a level change of the chip select signal CS_n, the accelerator may detect whether the level of the chip select signal CS_n has been changed to logic high by monitoring periodically or continuously monitoring the level of the chip select signal CS_n provided by the host (S35). As a detection result, when the level of the chip select signal CS_n has not been changed to logic high, the accelerator may continuously perform the accelerating process and the refresh operation. On the other hand, when the level of the chip select signal CS_n has been changed to logic high, an interval of the self-refresh mode may be determined as completed, and accordingly, the accelerator may stop the control operation for performing the refresh operation (S36).

According to an embodiment, to increase an interval of the accelerating process, even after the level of the chip select signal CS_n has been changed to logic high, the accelerating process may be performed during an interval. The accelerator may determine whether a present time point corresponds to an interval during which the accelerating process is performed, based on various signals from the host, or a counting operation inside the accelerator (S37), and based on a determination result, may perform operations for changing the occupation of the memory device. As an example, when the present time point corresponds to the interval during which the accelerating process is performed, accessing the memory device by the accelerator may be performed, and when the interval during which the accelerating process is performed has passed, the accelerator may control the selector (MUX) and deactivate the clock signal to change the occupation of the memory device to the host (S38).

Figure 9:
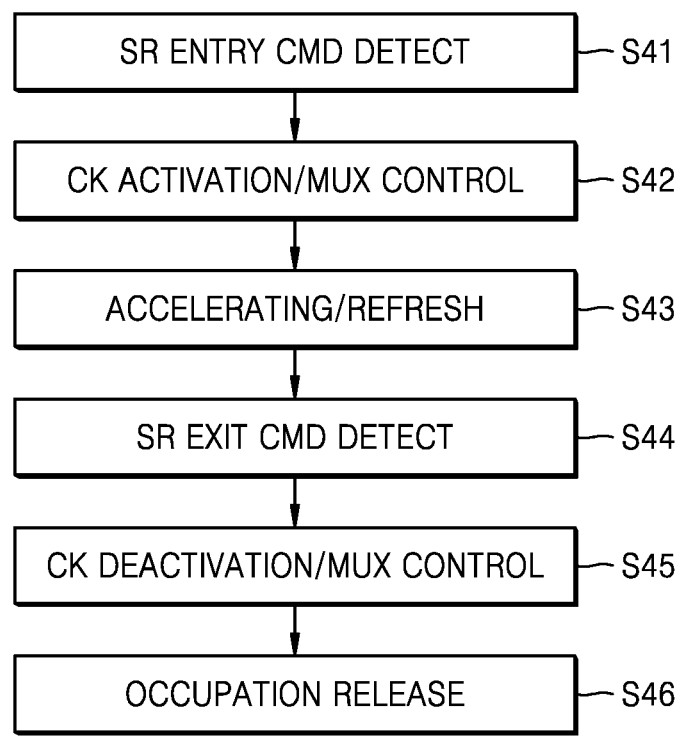
FIG. 9 is a flowchart of an operating method of an accelerator, according to another embodiment.

FIG. 9 is a flowchart of an operating method of an accelerator, according to another embodiment. In FIG. 9, an example of monitoring the exit from the self-refresh mode by monitoring the command/address signal is performed by the accelerator is illustrated.

According to the above-described embodiments, the host and the accelerator may communicate with the memory device by using various types of specifications, and as an example, a self-refresh (SR) entry command and an SR exit command may be defined in a DDRx specification including DDR4. The accelerator may detect the self-refresh entry command SR entry command provided by the host according to the above-described embodiments (S41), and may occupy the memory device by using activation of the clock signal and the control operation on the selector (MUX) in response to the self-refresh entry command SR entry command (S42). In addition, the accelerator may control the accelerating process and the refresh operation while occupying the memory device (S43), and may continuously perform the monitoring operation on the command/address signal provided by the host.

According to the monitoring result, whether the self-refresh exit command SR exit command has been provided by the host may be detected (S44), and based on a detection result, the accelerator may perform a deactivation operation of the clock signal and the control operation on the selector (MUX) as a series of operations for changing the occupation of the memory device to the host (S45). According to above-described operations, the accelerator may release the occupation of the memory device (S46), and the occupation of the memory device may be changed to the host.

Figure 10:
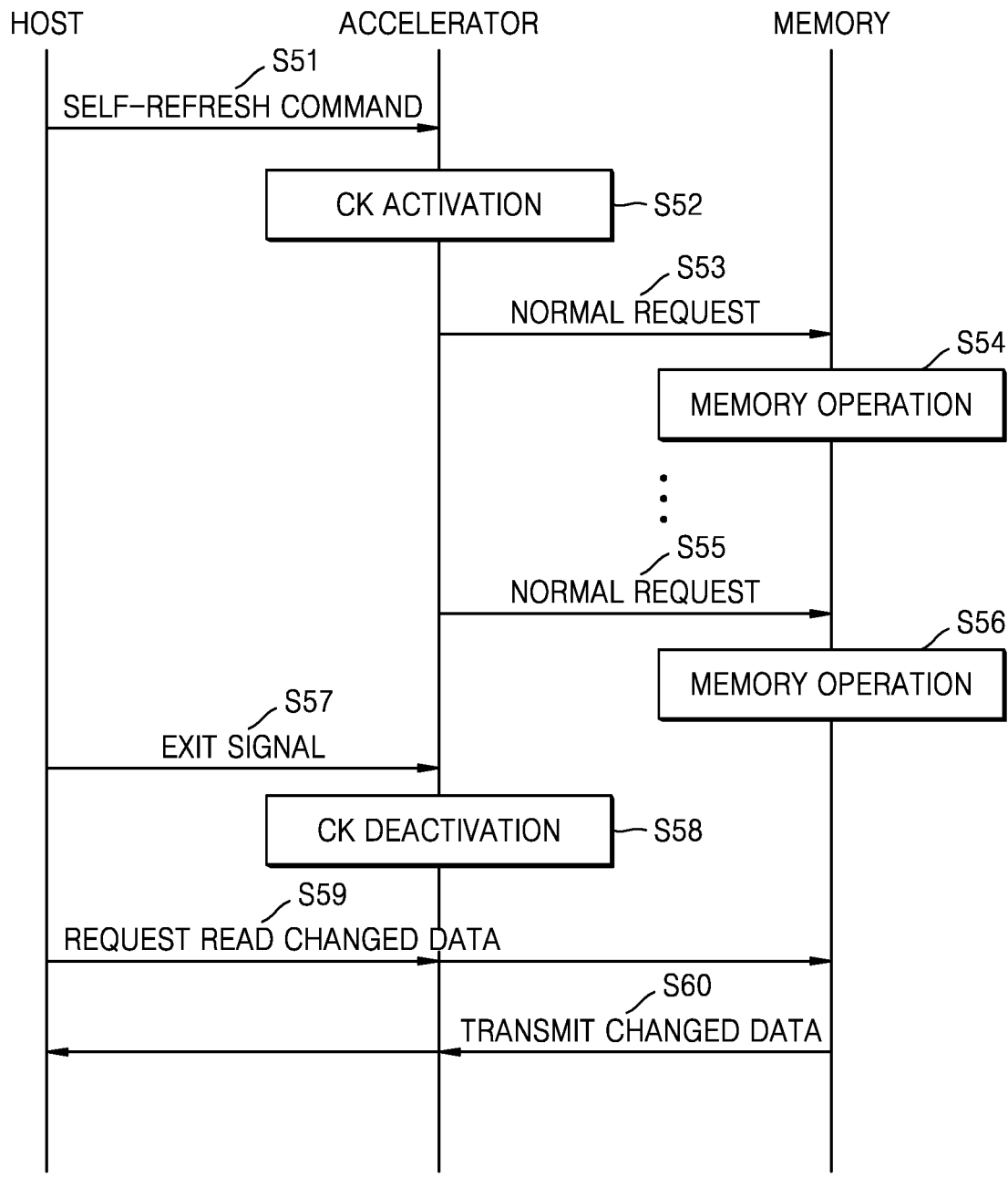
FIGS. 10 and 11 are flowcharts of an example in which an accelerating process result is fed back to a host, according to embodiments.
Figure 11:
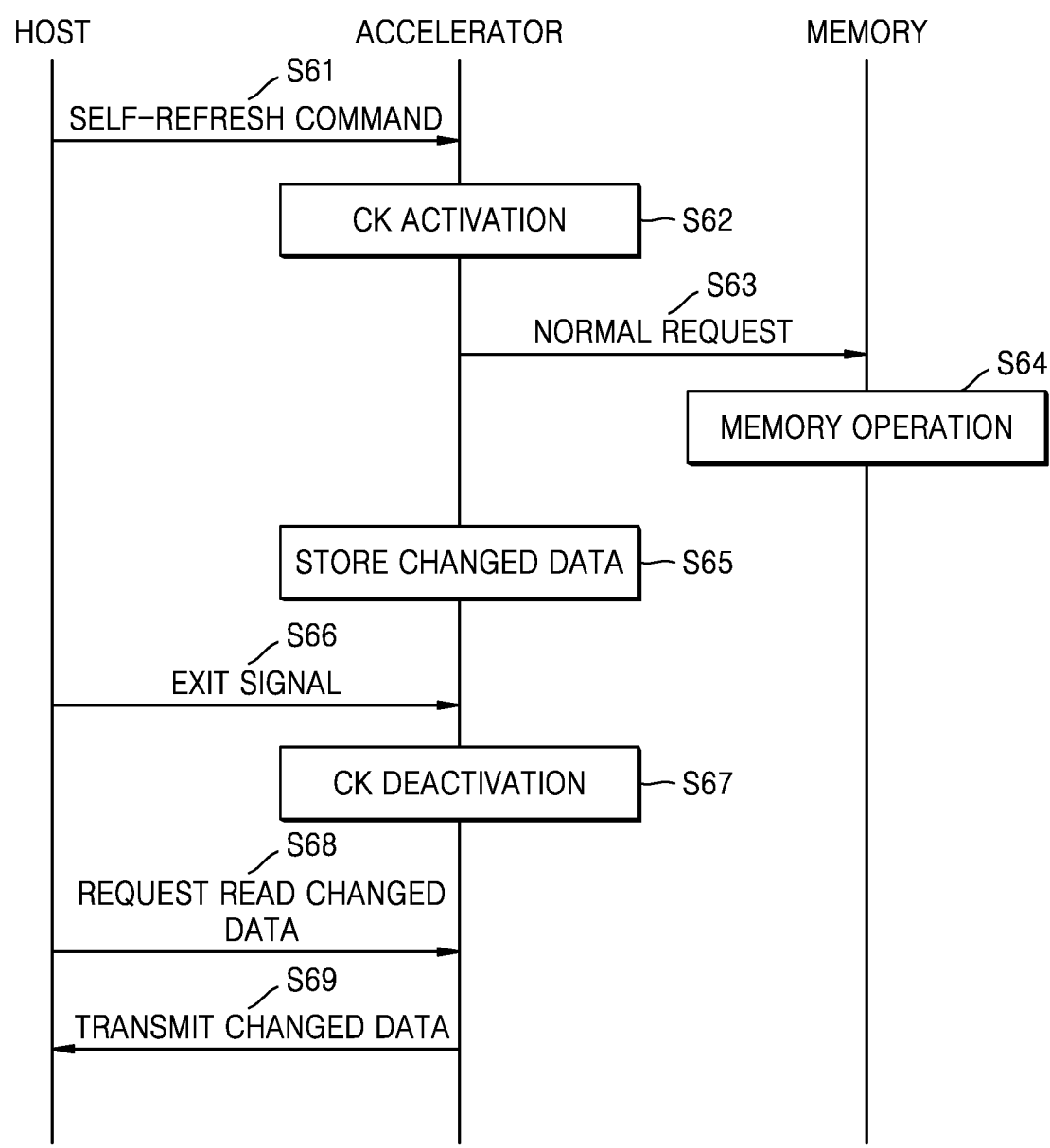

FIGS. 10 and 11 are flowcharts of an example in which an accelerating process result is fed backed to a host, according to embodiments. In FIGS. 10 and 11, when the accelerator occupies and uses the memory device, data stored in the memory device may be changed, and when the changed data is provided to the host, the host may determine a data update state of the memory device.

Referring to FIG. 10, according to the above-described embodiments, the host may provide the self-refresh command to the accelerator (S51), and the accelerator may occupy the memory device by performing operations such as activation of the clock signal and selector control (S52). In addition, the accelerator may perform the accelerating process of changing the data stored in the memory device while the accelerator occupies the memory device, and as an example, may write data to the memory device, or perform the calculation process by using data read from the memory device, and store the calculation process result to the memory device. Requests for writing and reading data, and storing the calculation process result as described above may correspond to a normal request, and transmission of the normal request by the accelerator and a memory operation of the memory device responding thereto may be performed a plurality of times (S53 through S56).

According to the above-described embodiments, the accelerator may receive an exit signal indicating an exit from the self-refresh mode from the host (S57), and may change the occupation of the memory device to the host by using operations such as deactivation of the clock signal and the selector control (S58). Thereafter, when the host occupies the memory device, the host may provide to the memory device the command/address signal for requesting reading of the changed data to obtain the changed data (S59), and the memory device may provide to the host the changed data in response thereto (S60).

In an embodiment, a location for storing data that has been changed by the accelerating process of the accelerator may be determined between the host and the accelerator, and as an example, information about storing location of the changed data may be transceived in the initialization process of the computing system. The host may determine an update state of data of the memory device after the self-refresh mode, based on the information about the storage location.

Referring to FIG. 11, the host may provide the self-refresh command in the same manner as in the above-described embodiment (S61), the accelerator may perform operations such as activation of the clock signal and the selector control (S62), the accelerator may provide the normal request to the memory device when the accelerator occupies the memory device (S63), and the memory device may perform the memory operation in response thereto (S64). In addition, the accelerator may store the data changed by the accelerating process to an internal chip (for example, the calculation chip in the above-described embodiment) (S65), and as an example, may store the data transmitted to the memory device to the calculation chip, or by reading the data stored in the memory device (the changed data).

Thereafter, according to the above-described embodiments, the accelerator may receive an exit signal from the host (S66), and may change the occupation of the memory device to the host by using operations such as deactivation of the clock signal and the selector control (S67). Thereafter, the host may request a read of the changed data stored in the calculation chip in the accelerator after occupying the memory device (S68), and the accelerator may provide the changed data as a host in response thereto (S69).

Figure 12:
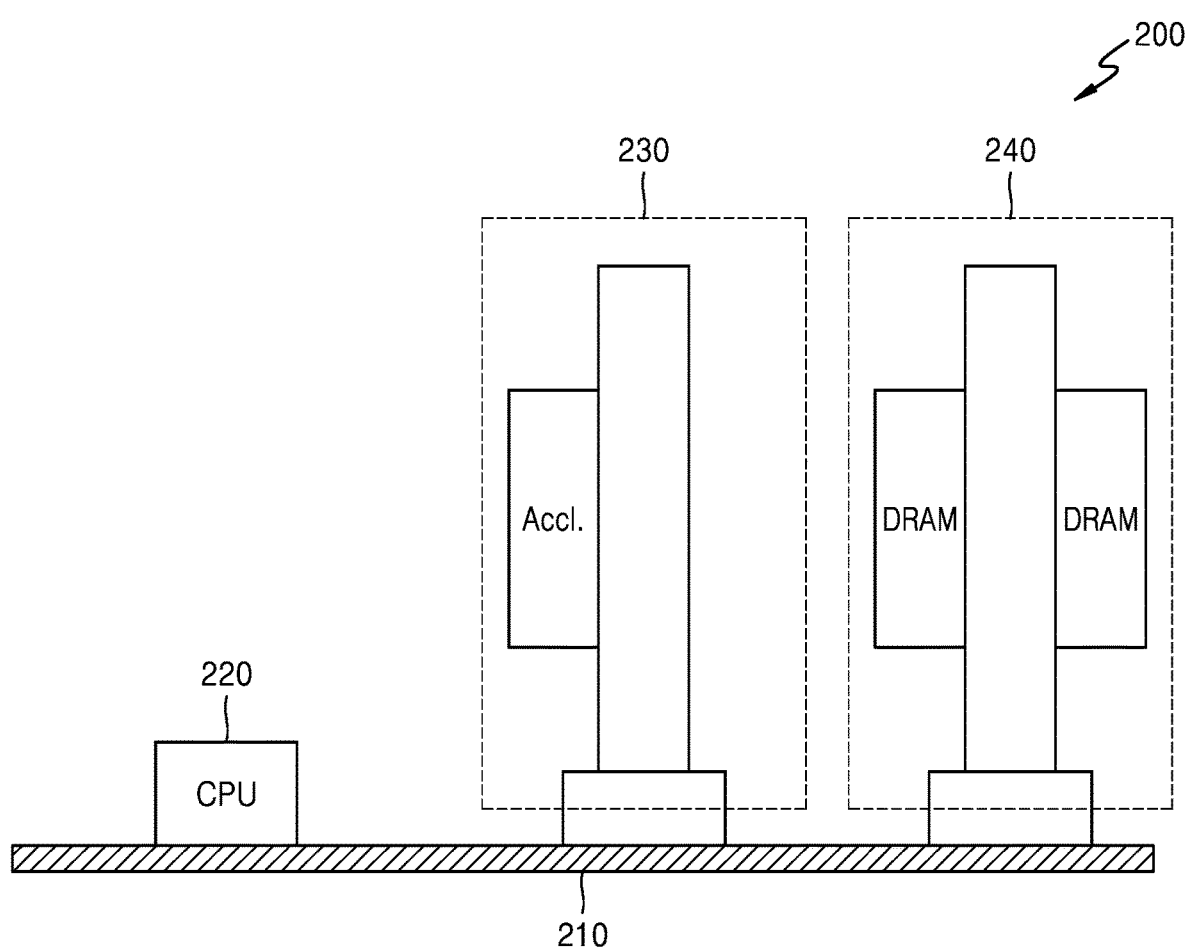
FIG. 12 is a diagram illustrating a structure of a computing system, according to an embodiment.

FIG. 12 is a diagram illustrating a structure of a computing system 200, according to an embodiment.

Referring to FIG. 12, various components provided in the computing system 200 in an embodiment may be mounted on a printed circuit board (PCB) 210, and as an example, the computing system 200 may include a host (or the CPU 220), an accelerator 230, and a memory device 240. The PCB 210 may include slots for mounting various components described above, and as an example, may include a CPU slot on which the CPU 220 is mounted, and a memory slot on which the memory device 240 is mounted. For example, in FIG. 12, although two memory slots are illustrated, according to the above-described embodiments, the memory device 240 may include a plurality of memory modules, and the PCB 210 may include greater number of memory slots.

The memory device 240 may include memory modules such as a single in memory module (SIMM) and a dual in memory module (DIMM), and in FIG. 12, an example is illustrated in which the DIMM is mounted on the DIMM slot as the memory device 240. In addition, the DIMM may include a plurality of DRAM chips mounted on both sides of the memory module.

According to an embodiment, the accelerator 230 may be mounted on one DIMM slot, and communicate between the CPU 220 and the memory device 240. As an example, the accelerator 230 may be mounted on one side of a module board, receive the command/address signal and data from the CPU 220, provide the command/address signal and data generated by the CPU 220 to the memory device 240, or provide the command/address signal and data generated by the accelerator 230 to the memory device 240. In addition, according to the above-described embodiments, the accelerator 230 may occupy and use the memory device 240 in the interval of the self-refresh mode directed by the CPU 220.

Figure 13:
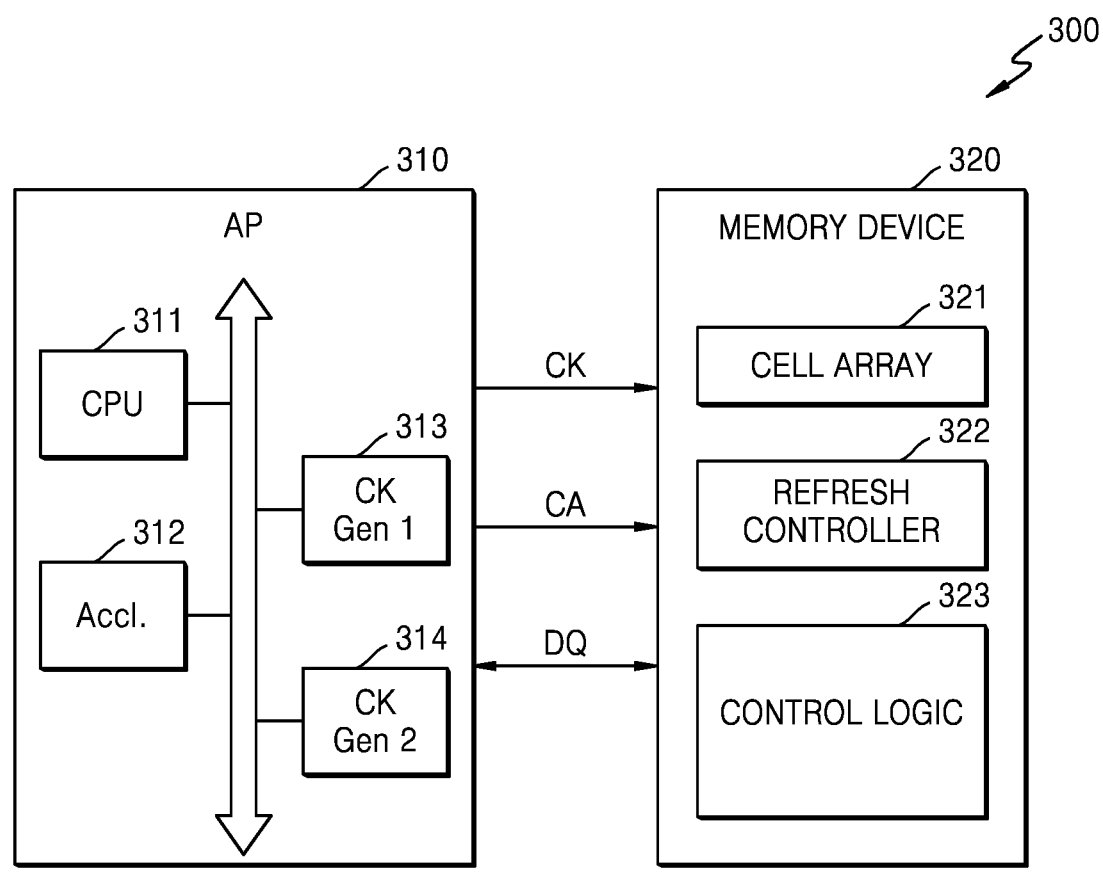
FIG. 13 is a block diagram of another example of a computing system.

FIG. 13 is a block diagram of another example of a computing system. In FIG. 13, a computing system 300 including an application processor 310 and a memory device 320 is illustrated. According to the above-described embodiments, the memory device 320 may include one or more memory chips (for example, DRAM chips), and may include a memory cell array 321, a refresh controller 322, and a control logic 323.

The application processor 310 may be implemented as a system on chip (SoC). The SoC may include a system bus to which a protocol having a certain standard bus specification is applied, and may include various IPs related to the system bus. As a standard specification of the system bus, an advanced microcontroller bus architecture (AMBA) protocol of the advanced RISC machine (ARM), Ltd. may be applied. A bus type of the AMBA protocol may include an advanced high-performance bus (AHB), an advanced peripheral bus (APB), an advanced extensible interface (AXI), AXI4, AXI coherency extensions (ACE), or the like. In addition, other types of protocols may also be applied, such as uNetwork by SONICs Inc., CoreConnect by IBM Corporation, and open core protocol by OCP-IP. In addition, as an example of the above-described IP, an application processor 310 may include a CPU 311 and an accelerator 312 according to the above-described embodiments. Further, when the application processor 310 includes a modem circuit, the application processor 310 may be referred to as a ModAP.

On the other hand, in an embodiment, the application processor 310 may further include one or more clock generators, for example, a first clock generator 313 and a second clock generator 314. The first clock generator 313 may generate the clock signal CK that is activated based on the control by the CPU 311, and the second clock generator 314 may generate the clock signal CK that is activated based on the control by the accelerator 312. Each of the CPU 311 and the accelerator 312 may generate the command/address signal CA and the data DQ to access the memory device 320.

According to the above-described embodiment, the CPU 311 and the accelerator 312 may selectively occupy the memory device 320, and as an example, the CPU 311 may generate a self-refresh entry command so that the memory device 320 enters the self-refresh mode. In addition, the CPU 311 may deactivate generation of the clock signal CK by controlling the first clock generator 313 during the self-refresh mode interval.

The accelerator 312 may include a selector (MUX) according to the above-described embodiments, and may detect the entry and the exit to and from the self-refresh mode by monitoring various signals from the CPU 311. The selector MUX may, based on the detection result, output to the memory device 320 the command/address signal CA and the data DQ from the CPU 311, or may output to the memory device 320 the command/address signal CA and the data DQ from the accelerator 312. In addition, while the accelerator 312 occupies the memory device 320, the accelerator 312 may activate generation of the clock signal CK by controlling the second clock generator 314.

Figure 14:
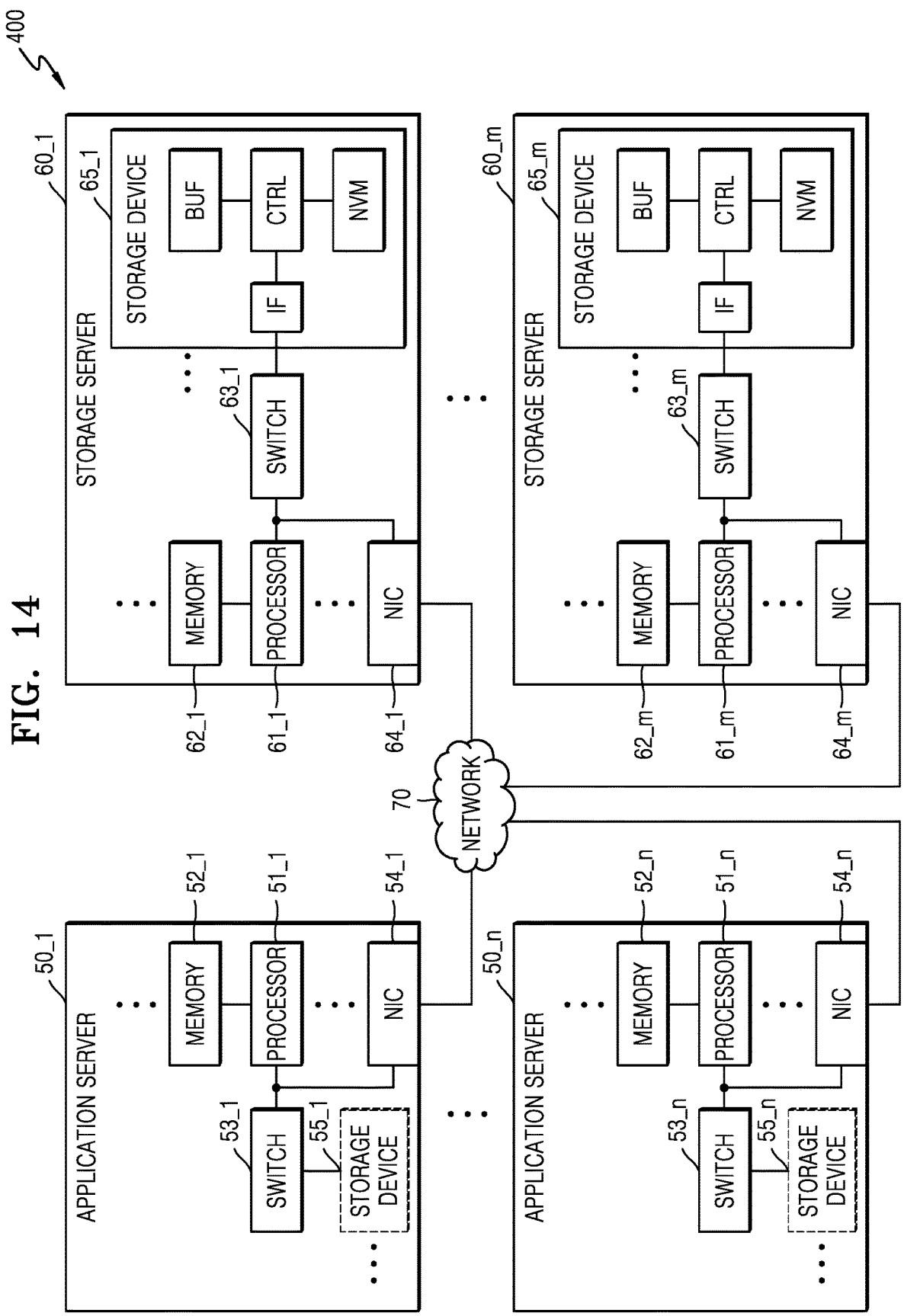
FIG. 14 is a block diagram illustrating a data center including a system, according to an embodiment.

FIG. 14 is a diagram of a data center 400 to which a system according to an embodiment is applied. The computing system described above with reference to the drawings may be included in an application server and/or a storage server of the data center 400.

Referring to FIG. 14, the data center 400 may include a facility that collects various types of pieces of data and provides services and be referred to as a data storage center. The data center 400 may include a system for operating a search engine and a database, and may include a computing system used by companies, such as banks and government agencies. The data center 400 may include first through $n^{th}$ application servers 50_1 through 50_$n$ and first through $m^{th}$ storage servers 60_1 through 60_$m$. The number of first through $n^{th}$ application servers 50_1 through 50_$n$ and the number of first through $m^{th}$ storage servers 60_1 through 60_$m$ may be variously selected according to embodiments. The number of first through $n^{th}$ application servers 50_1 through 50_$n$ may be different from the number of first through $m^{th}$ storage servers 60_1 through 60_$m$.

The first application server 50_1 and the first storage server 60_1 may include at least one of first processors 51_1 and 61_1, and at least one of first memories 52_1 and 62_1, respectively. The first storage server 60_1 is described as an example. The first processor 61_1 may control all operations of the first storage server 60_1, access the first memory 62_1, and execute instructions and/or data loaded in the first memory 62_1. The first memory 62_1 may be a double-data-rate synchronous DRAM (DDR SDRAM), a highbandwidth memory (HBM), a hybrid memory cube (HMC), a DIMM, an optane DIMM, and/or a non-volatile DIMM (NVMDIMM). In some embodiments, the numbers of first processors 61_1 and first memories 62_1 included in the first storage server 60_1 may be variously selected. In an embodiment, the first processor 61_1 and the first memory 62_1 may provide a processor-memory pair. In an embodiment, the number of first processors 61_1 may be different from the number of first memories 62_1. The first processor 61_1 may include a single-core processor or a multi-core processor. The above-description of the first storage server 60_1 may be similarly applied to the first application server 50_1. In some embodiments, the first application server 50_1 may not include a first storage device 55_1. The first storage server 60_1 may include at least one first storage device 65_1. The number of first storage devices 65_1 included in the first storage server 60_1 may be variously selected according to embodiments.

Although one processor is illustrated in each application server and each storage server in FIG. 14, a memory may be shared by at least two processors according to the above-described embodiments. For example, in the first application server 50_1, the first processor 51_1 may include a plurality of processors including a CPU and an accelerator, and the first memory 52_1 may be shared by the CPUs and the accelerators. In other words, the computing systems in the above-described embodiments may be applied to the application servers and the storage servers illustrated in FIG. 14, and the CPU or the accelerator may selectively occupy the memory according to an operation mode (for example, the self-refresh mode).

The first through $n^{th}$ application servers 50_1 through 50_n may communicate with the first through $m^{th}$ storage servers 60_1 through 60_m via a network 70. The network 70 may be implemented by using a fiber channel (FC) or Ethernet. In this case, the FC may include a medium used for relatively high-speed data transmission, and may use an optical switch with high performance and high availability. The first through $m^{th}$ storage servers 60_1 through 60_m may be provided as file storages, block storages, or object storages, according to an access method of the network 70.

In an embodiment, the network 70 may include a storage-dedicated network, such as a storage area network (SAN). For example, the SAN may include an FC-SAN, which uses an FC network and is implemented according to an FC protocol (FCP). As another example, the SAN may include an Internet protocol (IP)-SAN, which uses a transmission control protocol (TCP)/IP network and is implemented according to a small computer system interface (SCSI) over TCP/IP, or an Internet SCSI (iSCSI) protocol. In another embodiment, the network 70 may include a general network, such as a TCP/IP network. For example, the network 70 may be implemented according to a protocol, such as an FC over Ethernet (FCoE), a network attached storage (NAS), and an NVMe over fabrics (NVMe-oF).

Hereinafter, the first application server 50_1 and the first storage server 60_1 are mainly described. The description of the first application server 50_1 may be applied to other second through $n^{th}$ application servers 50_2 through 50_n, and the description of the first storage server 60_1 may be applied to other second through $m^{th}$ storage servers 60_2 through 60_m.

The first application server 50_1 may store data requested by a user or a client to be stored in one of the first through $m^{th}$ storage servers 60_1 through 60_m via the network 70. In addition, the first application server 50_1 may obtain data requested by the user or the client to be read from one of the first through $m^{th}$ storage servers 60_1 through 60_m via the network 70. For example, the first application server 50_1 may be implemented as a web server or a database management system (DBMS).

The first application server 50_1 may access first through $n^{th}$ memories 52_1 through 52_n or first through $n^{th}$ storage devices 55_1 through 55_n, which are included in other second through $n^{th}$ application servers 50_2 through 50_n, via the network 70. The first application server 50_1 may access the first through $m^{th}$ memories 62_1 through 62_m or first through $m^{th}$ storage devices 65_1 through 65_m, which are included in the first through $m^{th}$ storage servers 60_1 to 60_m, via the network 70. Thus, the first application server 50_1 may perform various operations on data stored in the first through $n^{th}$ application servers 50_1 through 50_n and/or the first through $m^{th}$ storage servers 60_1 through 60_m. For example, the first application server 50_1 may execute an instruction for transmitting or copying data between the first through $n^{th}$ application servers 50_1 through 50_n and/or the first through $m^{th}$ storage servers 60_1 through 60_m. In this case, the data may be transmitted from the first through $m^{th}$ storage devices 65_1 through 65_m of the first through $m^{th}$ storage servers 60_1 through 60_m to the first through $n^{th}$ memories 52_1 through 52_n of the first through $n^{th}$ application servers 50_1 through 50_n directly or via the first through $m^{th}$ memories 62_1 through 62_m of the first through $m^{th}$ storage servers 60_1 through 60_m. The data transmitted via the network 70 may be encrypted for security or privacy.

The first storage server 60_1 is described as an example. An interface may provide a physical connection between the first processor 61_1 and a controller (CTRL), and a physical connection between a first network interface card (NIC) 64_1 and the controller CTRL. For example, the interface may be implemented by using a direct attached storage (DAS) scheme in which the first storage device 65_1 is directly connected to a dedicated cable. For example, the interface may be implemented by using various interface schemes, such as advanced technology attachment (ATA), serial ATA (SATA), external SATA (e-SATA), SCSI, serial attached SCSI (SAS), peripheral component interconnection (PCI), PCI express (PCIe), NVM express (NVMe), IEEE 1394, an universal serial bus (USB) interface, a secure digital (SD) card, a multi-media card (MMC) interface, an embedded MMC (eMMC) interface, a universal flash storage (UFS) interface, an embedded UFS interface, and/or a compact flash (CF) card interface.

The first storage server 60_1 may further include a first switch 63_1 and the first NIC 64_1. The first switch 63_1 may selectively connect the first processor 61_1 to the first storage device 65_1 or selectively connect the first NIC 64_1 to the first storage device 65_1 via the control of the first processor 61_1.

In an embodiment, the first NIC 64_1 may include a network interface card and a network adaptor. The first NIC 64_1 may be connected to the network 70 via a wired interface, a wireless interface, a Bluetooth interface, or an optical interface. The first NIC 64_1 may include an internal memory, a digital signal processor (DSP), and a host bus interface, and may be connected to the first processor 61_1 and/or the first switch 63_1 via a host bus interface. The host bus interface may be implemented as one of the above-described examples of the interface. In an embodiment, the first NIC 64_1 may be integrated with at least one of the first processor 61_1, the first switch 63_1, and the first storage device 65_1.

In the first through m$^{th}$ storage servers 60_1 through 60_m or the first through n$^{th}$ application servers 50_1 through 50_n, a processor may transmit a command to program or read data to the first through n$^{th}$ storage devices 55_1 through 55_n and the first through m$^{th}$ 65_1 through 65_m, or the first through n$^{th}$ memories 52_1 through 52_n and the first through m$^{th}$ memories 62_1 through 62_m. In this case, the data may include data of which an error is corrected by an error correction code (ECC) engine. The data may include data on which a data bus inversion (DBI) operation or a data masking (DM) operation is performed, and may include cyclic redundancy code (CRC) information. The data may be encrypted for security or privacy.

The first through n$^{th}$ storage devices 55_1 through 55_n and the first through m$^{th}$ storage devices 65_1 through 65_m may transmit a control signal and a command/address signal to NAND flash memory devices in response to a read command received from a processor. Thus, when data is read by the NAND flash memory devices, a read enable (RE) signal may be input as a data output control signal, and thus, the data may be output to a data bus. A data strobe signal DQS may be generated by using the RE signal. The command and the address signal may be latched in a page buffer (BUF) depending on a rising edge or falling edge of a write enable (WE) signal.

The controller CTRL may control all operations of the first storage device 65_1. In an embodiment, a controller may include static read access memory (SRAM). The controller may write data to the NAND flash memory device in response to a write command or read data from the NAND flash memory device in response to a read command. For example, the write command and/or the read command may be provided by the first through m$^{th}$ processors 61_1 through 61_m of the first through m$^{th}$ storage servers 60_1 through 60_m, or the first through n$^{th}$ processors 51_1 through 51_n of the first through n$^{th}$ application servers 50_1 through 50_n. DRAM may temporarily store (or buffer) data to be written to the NAND flash memory device or data read from the NAND flash memory device. In addition, the DRAM may store meta-data. In this case, the meta-data may be user-data or data generated by a controller to manage the NAND flash memory device. The first through m$^{th}$ storage device 65_1 through 65_m may include secure elements (SE) for security or privacy.

At least one of the components, elements, modules or units (collectively "components" in this paragraph) represented by a block in the drawings may be embodied as various numbers of hardware, software and/or firmware structures that execute respective functions described above, according to an example embodiment. According to example embodiments, at least one of these components may use a direct circuit structure, such as a memory, a processor, a logic circuit, a look-up table, etc. that may execute the respective functions through controls of one or more microprocessors or other control apparatuses. Also, at least one of these components may be specifically embodied by a module, a program, or a part of code, which contains one or more executable instructions for performing specified logic functions, and executed by one or more microprocessors or other control apparatuses. Further, at least one of these components may include or may be implemented by a processor such as a central processing unit (CPU) that performs the respective functions, a microprocessor, or the like. Two or more of these components may be combined into one single component which performs all operations or functions of the combined two or more components. Also, at least part of functions of at least one of these components may be performed by another of these components. Functional aspects of the above exemplary embodiments may be implemented in algorithms that execute on one or more processors. Furthermore, the components represented by a block or processing steps may employ any number of related art techniques for electronics configuration, signal processing and/or control, data processing and the like.

While the inventive concept has been described with reference to example embodiments thereof, it will be understood that various changes in form and details may be made therein without departing from the spirit and scope of the following claims and their equivalents.

What is claimed is:

1. An accelerator comprising:
a signal control/monitoring circuit configured to detect an entry to a self-refresh mode of a memory device and an exit from the self-refresh mode based on monitoring a signal provided from a host;
an accelerator logic configured to generate a first command/address signal and a first piece of data; and
a selector configured to output the first command/address signal and the first piece of data to the memory device based on detection of the entry to the self-refresh mode, and output a second command/address signal and a second piece of data provided from the host to the memory device, based on detection of the exit from the self-refresh mode.

2. The accelerator of claim 1, wherein the signal control/monitoring circuit is further configured to output a mode select signal for controlling the selector, based on the detection of the entry to the self-refresh mode and the exit from the self-refresh mode.

3. The accelerator of claim 1, wherein the signal control/monitoring circuit is further configured to detect the entry to the self-refresh mode based on the signal provided from the host indicating a self-refresh command.

4. The accelerator of claim 1, wherein the signal provided from the host includes a chip select signal, and the signal control/monitoring circuit is further configured to detect the exit from the self-refresh mode by monitoring a change of a logic state of the chip select signal.

5. The accelerator of claim 4, wherein the chip select signal has a wave form defined by a double data rate 5 (DDR5) specification, and
the signal control/monitoring circuit is further configured to detect the exit from the self-refresh mode based on a change of the logic state of the chip select signal from a first logic state to a second logic state.

6. The accelerator of claim 5, wherein an access to the memory device by the accelerator is stopped at a time point at which the logic state of the chip select signal is changed to the second logic state.

7. The accelerator of claim 5, wherein the logic state of the chip select signal is maintained in the second logic state during a first interval and then is changed to the first logic state, and
an access to the memory device by the accelerator is maintained in at least a portion of the first interval.

8. The accelerator of claim 1, further comprising a clock generator configured to generate a clock signal based on control by the signal control/monitoring circuit,
wherein the clock generator is further configured to activate and output the clock signal to the memory device while the accelerator accesses the memory device.

9. The accelerator of claim 8, wherein the clock generator is further configured to activate the clock signal based on detection of the entry to the self-refresh mode, and deactivate the clock signal based on detection of the exit from the self-refresh mode.

10. The accelerator of claim 1, wherein the accelerator is further configured to:
store, in the accelerator logic, data that has been changed while the accelerator accesses the memory device; and
after the exit from the self-refresh mode, provide the changed data to the host.

11. A computing system comprising:
a memory device comprising one or more channels;
a host configured to generate a first command/address signal and a first piece of data, and generate a self-refresh command for controlling the memory device to enter a self-refresh mode; and
an accelerator comprising an accelerator logic configured to generate a second command/address signal and a second piece of data, the accelerator being configured to provide the first command/address signal and the first piece of data to the memory device while the host occupies the memory device, and provide the second command/address signal and the second piece of data, generated by the accelerator logic, to the memory device based on detection of the self-refresh command generated by the host.

12. The computing system of claim 11, wherein the accelerator further comprises:
a signal control/monitoring circuit configured to generate a mode select signal; and
a selector configured to, according to the mode select signal, provide the first command/address signal and the first piece of data to the memory device, or provide the second command/address signal and the second piece of data to the memory device.

13. The computing system of claim 12, wherein the host is further configured to generate a chip select signal, and
the signal control/monitoring circuit is further configured to detect an exit from the self-refresh mode by monitoring a change of a logic state of the chip select signal, and control the mode select signal for controlling the selector to provide the first command/address signal and the first piece of data to the memory device based on detection of the exit from the self-refresh mode.

14. The computing system of claim 12, wherein the memory device comprises a first channel and a second channel individually communicating with the accelerator via independent paths, and
the selector comprises a first selector correspondingly to the first channel, and a second selector correspondingly to the second channel.

15. The computing system of claim 11, wherein the accelerator further comprises a clock generator configured to generate a clock signal for accessing the memory device, and
based on the detection of the self-refresh command, the clock signal is activated and provided to the memory device.

16. The computing system of claim 11, wherein the memory device comprises a dual in memory module (DIMM),
the computing system further comprises a printed circuit board (PCB) on which a plurality of DIMM slots are provided, the memory device being mounted on the plurality of DIMM slots, and
the accelerator is mounted on any one of the plurality of DIMM slots.

17. The computing system of claim 11, wherein the host is further configured to generate a self-refresh exit command for controlling the memory device to exit from the self-refresh mode, and
the accelerator is further configured to, based on detection of the self-refresh exit command from the host, provide the first command/address signal and the first piece of data to the memory device.

18. The computing system of claim 11, wherein the memory device is configured to communicate with the host and the accelerator based on a double data rate 5 (DDR5) specification.

19. A method of operating an accelerator, the method comprising:
receiving a first command/address signal and a first piece of data generated by a host and transmitting the received first command/address signal and the received first piece of data to a memory device;
detecting an entry to a self-refresh mode of the memory device by monitoring a signal from the host;
generating a first clock signal used for accessing the memory device, based on a result of the detecting; and
accessing to the memory device by providing, to the memory device, the first clock signal, a second command/address signal, and a second piece of data, the second command/address signal and the second piece of data being generated by the accelerator.

20. The method of claim 19, further comprising:
detecting an exit from the self-refresh mode of the memory device by monitoring the signal from the host;
based on detection of the exit from the self-refresh mode, deactivating generation of the first clock signal; and
transmitting to the memory device the first command/address signal and the first piece of data.

* * * * *